(12) United States Patent
Takaike

(10) Patent No.: US 7,847,411 B2
(45) Date of Patent: Dec. 7, 2010

(54) ELECTRONIC DEVICE AND METHOD OF MANUFACTURING THE SAME

(75) Inventor: Eiji Takaike, Nagano (JP)

(73) Assignee: Shinko Electric Industries Co., Ltd., Nagano-shi, Nagano (JP)

(*) Notice: Subject to any disclaimer, the term of this patent is extended or adjusted under 35 U.S.C. 154(b) by 432 days.

(21) Appl. No.: 10/577,017

(22) PCT Filed: Nov. 1, 2004

(86) PCT No.: PCT/JP2004/016244

§ 371 (c)(1),
(2), (4) Date: Apr. 24, 2006

(87) PCT Pub. No.: WO2005/045925

PCT Pub. Date: May 19, 2005

(65) Prior Publication Data

US 2007/0158832 A1    Jul. 12, 2007

(30) Foreign Application Priority Data

Nov. 7, 2003   (JP)   ............................. 2003-377892
Apr. 26, 2004  (JP)   ............................. 2004-130217

(51) Int. Cl.
H01L 23/48   (2006.01)
H01L 23/52   (2006.01)
H01L 29/40   (2006.01)

(52) U.S. Cl. ............... 257/777; 257/688; 257/686; 257/692; 257/698; 257/774

(58) Field of Classification Search ............... 257/686, 257/688, 692, 698, 774, 777
See application file for complete search history.

(56) References Cited

U.S. PATENT DOCUMENTS

| 4,811,082 A | * | 3/1989 | Jacobs et al. ............... 257/700 |
| 6,306,680 B1 |  | 10/2001 | Fillion et al. |
| 2002/0052065 A1 | * | 5/2002 | Ogura ............... 438/128 |
| 2002/0182771 A1 |  | 12/2002 | Akram |
| 2003/0038415 A1 | * | 2/2003 | Anderson et al. ........... 267/160 |
| 2003/0185484 A1 | * | 10/2003 | Chakravorty et al. ......... 385/14 |
| 2004/0033654 A1 | * | 2/2004 | Yamagata ............... 438/202 |

(Continued)

FOREIGN PATENT DOCUMENTS

JP   02126625   5/1990

(Continued)

OTHER PUBLICATIONS

European Search Report: dated Jun. 26, 2009; Application No. EP04799450.

*Primary Examiner*—Zandra Smith
*Assistant Examiner*—Telly D Green
(74) *Attorney, Agent, or Firm*—Ladas & Parry LLP

(57) ABSTRACT

An electronic device wherein an electronic element is electrically connected to a substrate through an interposer and a method of manufacturing the same are disclosed. The electronic device comprises an electronic element and an interposer including an interposer base to which the electronic element is joined and plural post electrodes connected to corresponding electrodes of the electronic element. In the electronic device, the electronic element and the interposer base are integrated with each other by being brought into direct contact with each other, and the post electrodes are formed directly on the corresponding electrodes of the electronic element.

17 Claims, 19 Drawing Sheets

U.S. PATENT DOCUMENTS

| | | | |
|---|---|---|---|
| 2004/0070064 A1* | 4/2004 | Yamane et al. | 257/686 |
| 2004/0084781 A1* | 5/2004 | Ahn et al. | 257/777 |
| 2004/0150104 A1* | 8/2004 | Terui | 257/734 |

FOREIGN PATENT DOCUMENTS

| | | |
|---|---|---|
| JP | 2000349194 | 12/2000 |
| JP | 20017236 | 1/2001 |
| JP | 2001223287 | 8/2001 |
| JP | 2002134545 | 5/2002 |
| JP | 2002164369 | 6/2002 |

* cited by examiner

ELECTRONIC DEVICE AND METHOD OF MANUFACTURING THE SAME

TECHNICAL FIELD

The present invention generally relates to an electronic device and a method of manufacturing the same, and particularly relates to an electronic device wherein an electronic element is electrically connected to a substrate through an interposer and a method of manufacturing the same.

BACKGROUND ART

In a typical semiconductor device, a semiconductor chip is joined to an interposer. For example, in a semiconductor device using a lead frame as an interposer, a semiconductor chip is secured to a die pad formed on the lead frame as an interposer, while the lead frame and the semiconductor chip are electrically connected to each other through a wire.

To meet recent increase in density of semiconductor chips and in the number of pins thereof, semiconductor devices having package structures called BGA (Ball Grid Array) or LGA (Land Grid Array) are often used. In these semiconductor devices, semiconductor chips on which bumps are formed are mounted on substrates as interposers by flip chip technology.

Electrode pads to which solder bumps are joined and electrode pads to which external connection terminals (solder balls or leads) are joined are formed on the front surfaces and the back surfaces, respectively, of the interposers used for BGA or LGA. The electrode pads disposed on the front surfaces and the electrode pads disposed on the back surfaces are electrically connected to each other through vias formed extending through interposer bases.

In such a package structure, a semiconductor chip and an interposer are electrically and mechanically connected through a bump, so that the mechanical joining between the semiconductor chip and the interposer is weak. To increase mechanical strength of a joint portion between the semiconductor chip and the interposer, underfill resin is provided between the semiconductor chip and the interposer.

Other than the above-described BGA and LGA, semiconductor devices of chip size package type (hereinafter referred to as CSPs), such as the one disclosed, for example, in Patent Document 1, are known. The CSPs are packaged into substantially the same size as semiconductor chips (bare chips).

The CSPs include solder bumps or posts as external connection terminals (that are soldered to semiconductor chips), and the semiconductor chips are mounted on substrates (considered as a type of interposer) using flip chip technology. It is to be noted that the posts are soldered to electrodes on the semiconductor chips (see, for example, Japanese Patent Laid-Open Publication NO. 2002-164369).

DISCLOSURE OF THE INVENTION

Problems to be Solved by the Invention

Demands for increasing density of semiconductor devices are becoming more stringent. The terminal-to-terminal pitch required before was 150 µm, but the pitch required now is as small as 70 µm. If the terminal-to-terminal pitch is 150 µm, design rules can be relatively loose. For example, both the line width and line space of line-and-space patterns may be about 15 µm.

However, if the terminal-to-terminal pitch is reduced to as small as 70 µm, lines and spaces in semiconductor chips become so small that adjacent solder bumps might be short circuited during flip-chip joining. Moreover, the size reduction makes it difficult to form electrode pads on front and back surfaces on interposer bases and to form vias to extend through the interposer bases, resulting in increase in the production costs of interposers.

Means for Solving the Problem

The present invention aims to provide an improved and useful electronic device that may solve one or more problems in the prior art described above.

More specifically, the present invention aims to provide an electronic device that can easily meet requirements of pitch reduction and be produced at lower production cost, and a method of manufacturing the same.

According to an aspect of the present invention, there is provided an electronic device that comprises an electronic element; and an interposer including an interposer base to which the electronic element is joined, and plural post electrodes connected to corresponding electrodes of the electronic element; wherein the electronic element and the interposer base are integrated with each other by being brought into direct contact with each other, and the post electrodes are formed directly on the corresponding electrodes of the electronic element.

According to another aspect of the present invention, there is provided an electronic device that comprises an electronic element; and an interposer including an interposer base to which the electronic element is joined, and plural post electrodes that are disposed inside one or more through holes formed in the interposer base and are connected to corresponding electrodes of the electronic element; wherein a surface of the electronic element and a surface of the interposer base are integrated with each other by being brought into direct contact with each other, and the post electrodes are formed directly on the corresponding electrodes of the electronic element.

In the above-described configuration, since the electronic element and the interposer are directly joined together, there is no need to provide bumps and underfill resin for joining the electronic element and the interposer. Accordingly, the number of component parts and the thickness of the electronic device can be reduced. In addition, since the interposer is electrically connected to the electronic element via the post electrodes, the terminal-to-terminal pitch can be reduced compared to a connection structure using bumps. Accordingly, density of the electronic device can be increased. Moreover, since the electronic element and the interposer base are integrated by being brought into direct contact with each other, the electronic element and the interposer base are joined together more firmly compared to the connection structure using bumps and under fill resin.

In the above-described electronic devices, it is preferable that the electronic element and the interposer base be made of the same material.

With this configuration, the surface of the electronic element and the surface of the interposer base can be integrated with each other more securely and firmly.

In the above-described electronic devices, it is also preferable that the electronic element and the interposer base be made of silicon.

In the above-described electronic devices, it is also preferable that a first insulation layer be formed at least in a position on the electronic element to be joined to the interposer base, and a second insulation layer be formed at least in a position on the interposer base to be joined to the electronic element.

If the insulation layers are formed only in the positions where the interposer base and the electronic element are joined together, the size of areas to be highly smoothened can be reduced. Therefore, the process of forming the insulation layers can be facilitated. On the other hand, if the insulation layers are formed on the corresponding entire surfaces of the electronic element and the interposer base, the insulation layers serve as protective layers for protecting the electronic element and the interposer base.

In the above-described electronic devices, it is also preferable that the post electrodes be formed in a single through hole.

With this configuration, since the plural post electrodes are disposed in the single through hole, the through hole can be formed with lower accuracy than the post electrodes. Therefore, the through hole can be formed easily.

In the above-described electronic devices, it is also preferable that a recess be formed in the interposer base such that the electronic element is accommodated in the recess.

With this configuration, since the electronic element can be accommodated in the recess formed in the interposer, the thickness of the electronic device can be reduced.

In the above-described electronic devices, it is also preferable that plural of the electronic elements be mounted on the interposer base.

If plural of the electronic elements are mounted on the interposer base as described above, elements such as the post electrodes can be formed on the electronic elements at the same time. Accordingly, manufacturing efficiency can be improved.

In the above-described electronic devices, it is also preferable that a back surface of the electronic element be joined to the interposer base.

With this configuration, since the back face of the electronic element is joined to the interposer base, the size of the joining area between the electronic element and the interposer base can be increased. Therefore, the electronic element is attached more firmly.

In the above-described electronic devices, it is also preferable that a sealing resin encapsulating the electronic element be disposed on the interposer base.

If the sealing resin encapsulating the electronic element is disposed on the interposer base as described above, the electronic element is secured to the interposer base by being encapsulated with the sealing resin. Accordingly, the electronic element can be securely protected, and can be attached more firmly to the interposer base.

In the above-described electronic devices, it is also preferable that the electronic element be a semiconductor chip.

In the above-described electronic devices, it is also preferable that the electronic element be a passive element.

According to still another aspect of the present invention, there is provided a method of manufacturing an electronic device that comprises an integrating step of integrating an interposer base in which a through hole is formed and an electronic element with each other by bringing a surface of the interposer base and a surface of the electronic element into direct contact with each other, a post electrode forming step of forming a post electrode inside the through hole and directly on an electrode of the electronic element after the integrating step; a rewiring forming step of forming a rewiring layer electrically connected to the post electrode, and an external connection terminal forming step of forming an external connection terminal on the rewiring layer.

With the above-described method, since the electronic element and the interposer base are integrated with each other by being brought into direct contact with each other in the integrating step, there is no need to provide bumps and underfill resin for joining the electronic element and the interposer. Accordingly, manufacturing processes can be simplified.

Also, since the integrating step is followed by the post electrode forming step in which the post electrode is formed inside the through hole and directly on the electrode of the electronic element, impedance between the electronic element and the interposer can be reduced, thereby improving electrical properties. In addition, since the post electrode can be formed using the through hole formed in the interposer base as a mold, the post electrode can be easily formed.

According to a further aspect of the present invention, there is provided a method of manufacturing an electronic device that comprises a post electrode forming step of forming a post electrode directly on an electrode of an electronic element, an integrating step of integrating an interposer base in which a through hole is formed and the electronic element with each other by bringing a surface of the interposer base and a surface of the electronic element into direct contact with each other after the post electrode forming step, a rewiring forming step of forming a rewiring layer electrically connected to the post electrode, and an external connection terminal forming step of forming an external connection terminal on the rewiring layer.

With the above-described method, since the electronic element and the interposer base are integrated with each other by being brought into direct contact with each other in the integrating step, there is no need to provide bumps and underfill resin for joining the electronic element and the interposer. Accordingly, manufacturing processes can be simplified. Also, since the post electrode is formed directly on the electrode of the electronic element in the post electrode forming step, impedance between the electronic element and the interposer can be reduced, thereby improving electrical properties. In addition, the integrating step is performed after the post electrode forming step, and the post electrode can be formed without using the through hole formed in the interposer base. Accordingly, the size of the post electrode can be reduced compared to the method of forming the post electrode using the through hole formed in the interposer base.

It is preferable that the above-described method of forming an electronic device further comprise a protective layer forming step of forming a protective layer on the electronic element, the protective layer being made of an insulating material and adapted to hold the post electrode.

If the above-described method further comprises the protective layer forming step of forming the protective layer on the electronic element, the protective layer being made of an insulating material and adapted to hold the post electrode, the post electrode is held by the protective layer formed directly on the electronic element. Accordingly, the post electrode can be surely protected even if the size of the post electrode is reduced.

According to a further aspect of the present invention, there is provided an electronic device that comprises an electronic element, and an interposer to which the electronic element is joined, wherein the electronic element and the interposer are integrated with each other by being brought into direct contact with each other.

In the above-described configuration, since the electronic element and the interposer are directly joined together, there is no need to provide bumps and underfill resin for joining the electronic element and the interposer. Accordingly, the number of component parts and the thickness of the electronic device can be reduced.

In the above-described electronic device, it is preferable that the electronic element be an optical device, and the interposer be provided with an optical waveguide optically connected to the optical device.

In the above-described configuration, since the optical device and the interposer are directly joined together, there is no need to provide bumps and underfill resin for joining the optical device and the interposer. Accordingly, adhesion of solder and resin to an optical surface of the optical device can be avoided.

Advantageous Effect of the Invention

According to an aspect of the present invention, since there is no need to provide bumps and underfill resin for joining the electronic element and the interposer together, the number of component parts and the thickness of the electronic device can be reduced. In addition, since the terminal-to-terminal pitch can be reduced compared to the connection structure using bumps, density of the electronic device can be increased. Moreover, since the electronic element and the interposer base are integrated by being brought into direct contact with each other, the electronic element and the interposer base can be joined together more firmly compared to the connection structure using bumps and underfill resin.

BRIEF DESCRIPTION OF THE DRAWINGS

FIG. 4C (continued) is a diagram for explaining the method of manufacturing the semiconductor device of the first embodiment;

FIG. 4D (continued) is a diagram for explaining the method of manufacturing the semiconductor device of the first embodiment;

FIG. 8C (continued) is a diagram for explaining the method of manufacturing the semiconductor device of the third embodiment;

FIG. 9 is a cross-sectional view showing a semiconductor device according to a fourth embodiment of the present invention;

Figure 1:
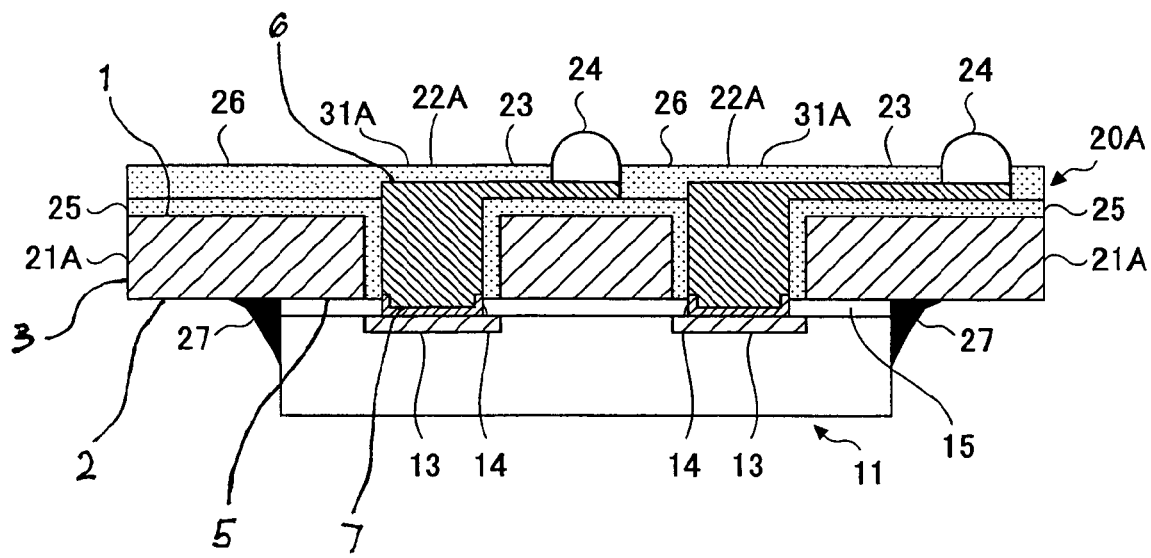
FIG. 1 is a cross-sectional view showing a semiconductor device according to a first embodiment of the present invention.

EXPLANATION OF SYMBOLS 10A-10R semiconductor device
10S-10V electronic device
11 semiconductor chip
13 electrode
14 barrier metal portion
15 insulation film
16 chip-side PI film
17 protective layer
20A-2V interposer
21A-21M interposer base
22A, 22B post electrode
23 rewiring layer
24 external connection terminal
25 first insulation layer
26 second insulation layer
27 joint reinforcing member
28 interposer-side PI film
29 reinforcing member
30, 39 recess
31A-31C through hole
32 first resist
33, 36, 37 opening
34 electrode hole
35 second resist
40A-40D cavity
46A, 46B sealing resin
50A-50C chip part
52 first cladding layer
53 second cladding layer
54 core layer
55 light emitting element
56 light receiving element
57 reflection member
59 wiring pattern
60, 61 post-shaped electrode

BEST MODE FOR CARRYING OUT THE INVENTION

The following describes preferred embodiments of the present invention with reference to the accompanying drawings.

FIG. 1 is a cross-sectional view showing an electronic device 10A according to a first embodiment of the present invention. The electronic device 10A of this embodiment has a simple structure, comprising a semiconductor chip 11 and an interposer 20A (hereinafter an electronic device using a semiconductor chip as an electronic element is referred to as a semiconductor device).

The semiconductor chip 11 has a high density, and comprises plural electrodes 13 on a circuit forming surface side. The electrodes 13 are, for example, aluminum electrodes. A barrier metal portion 14 is formed on an upper surface of each electrode 13. Although not shown, the barrier metal portion 14 is formed of a lamination of plural metal films. The outermost layer of the barrier metal portion 14 is made of a copper (Cu) film.

The circuit forming surface of the semiconductor chip 11 is covered with an insulation film 15 except where the electrodes 13 are formed. In this embodiment, the semiconductor chip 11 is formed from a silicon substrate, and the insulation film 15 is made of silicon dioxide ($SiO_2$).

Silicon dioxide has high electrical insulating properties and physical stability. Therefore, a thin film circuit formed on the semiconductor chip 11 is protected by the insulation film 15. A predetermined area of the insulation film 15 is integrated with the semiconductor chip 11 by being brought into contact therewith as described below. The surface of at least this contact area of the insulation film 15 is very smooth.

Although the distance between the adjacent electrodes 13 is shown enlarged in FIG. 1 for clarity, the semiconductor chip 11 has a high density as mentioned above. Accordingly, the pitch (terminal-to-terminal pitch) between the adjacent electrodes 13 is small. More specifically, the terminal-to-terminal pitch between the adjacent electrodes 13 is equal to 100 μm or less in this embodiment.

The interposer 20A comprises an interposer base 21A, post electrodes 22A, rewiring layers 23, external connection terminals 24, a second insulation layer 26, etc. As shown in FIG. 1, an upper principal surface 1, a lower principal surface 2, and a sidewall surface 3 connecting said upper principal surface 1 and said lower principal surface 2 define the interposer base 21A and are thus outer surfaces of the interposer base 21A. The interposer base 21A is made of silicon. The post electrodes 22A are formed in the positions corresponding to the electrodes 13 of the semiconductor chip 11. As shown in FIG. 1, each of the post electrodes 22A has a top end 6 exposed at the upper principal surface 1 of the interposer base and a bottom end 7 exposed at the lower principal surface 2 of the interposer base 21A.

The post electrodes 22A are made of copper (Cu). The post electrodes 22A are disposed inside corresponding through holes 31A formed in the interposer base 21A. To prevent short-circuiting the interposer base 21A and the post electrodes 22A, a first insulation layer 25 (indicated by dotted areas) is formed between the interposer base 21A and the post electrodes 22A. In this embodiment, the first insulation layer 25 is made of polyimide resin.

The lower end (in FIG. 1) of each post electrode 22A is directly joined to the corresponding barrier metal portion 14, while the upper end thereof is electrically connected to the corresponding rewiring layer 23. Similar to the post electrodes 22A, the rewiring layers 23 are also made of copper, and have predetermined patterns. The external connection terminals 24 are provided for external connection. Each of the external connection terminals 24 is formed on an end of the corresponding rewiring layer 23 opposite to the end connected to the post electrode 22A. The external connection terminals 24 may be formed of, for example, solder balls.

The second insulation layer 26 is formed on the upper side of the rewiring layers 23. The second insulation layer 26 is provided to mainly protect the rewiring layers 23. Similar to the first insulation layer 25, the second insulation layer 26 is also made of polyimide resin.

The following describes the joining structure between the semiconductor chip 11 and the interposer base 21A and the electrical connection structure between the electrodes 13 and the post electrodes 22A.

Directing attention first to the joining structure between the semiconductor chip 11 and the interposer base 21A, the semiconductor chip 11 is joined to the interposer base 21A without using adhesive or brazing materials, and without using joining processes utilizing heat such as welding. As shown in FIG. 1, a top principal surface 5 of the semiconductor chip 11 is in direct contact with the lower principal surface 2 of the interposer base 21A.

In this embodiment, a joint area of the semiconductor chip 11 and a joint area of the interposer base 21A, which are to be joined together, have highly smooth surfaces (mirror surfaces). The semiconductor chip 11 and the interposer base 21A are placed in a vacuum environment, and then the smooth surfaces are brought into contact with and pressed against each other. The smooth surfaces are thus put in tight contact with and integrated with each other without using adhesive or the like. As a result, the semiconductor chip 11 and the interposer base 21A are firmly joined together (this joining method is hereinafter referred to as a small base surface joining method).

The portions to be joined together are preferably made of the same material or the same type of material. More specifically, the portion of the semiconductor chip 11 and the portion of the interposer base 21A to be joined together are preferably made of the same material or the same type of material. This causes a joining force between the semiconductor chip 11 and the interposer base 21A to be increased and therefore reliability of the semiconductor device 10A can be improved.

In this embodiment, the insulation film 15, which corresponds to the joint portion of the semiconductor chip 11, is made of $SiO_2$. On the other hand, the interposer base 21A is made of silicon, but a thin film layer of $SiO_2$ (not shown) is usually formed on the surface of the interposer base 21A. That is, the joint portion of the semiconductor chip 11 and the joint portion of the interposer base 21A are made of the same material.

Moreover, as mentioned above, both the joint portion of the semiconductor chip 11 and the joint portion of the interposer base 21A have smooth surfaces. Therefore, in this embodiment, the semiconductor chip 11 and the interposer 20A are integrated with each other by bringing the joint areas having smooth surfaces into contact with each other and pressing the joint areas against each other. Thus, the top principal surface 5 of the semiconductor chip directly contacts the lower principal surface 2 of the interposer base 21A.

In this way, in this embodiment, the semiconductor chip 11 and the interposer 20A (interposer base 21A) are integrated by being brought into direct contact with each other.

Accordingly, compared to conventional structures of joining a semiconductor chip and an interposer together using bumps and underfill resin, the semiconductor chip 11 and the interposer 20A can be joined more firmly.

In this embodiment, since sealing resin for encapsulating the semiconductor chip 11 is not provided, heat releasing efficiency can be increased. In addition, since the semiconductor chip 11 and the interposer 20A can be joined together by just being brought into contact with each other in a vacuum environment, the number of component parts required for joining can be reduced.

In this embodiment, a joint reinforcing member 27 is disposed at a step formed as a result of joining the semiconductor chip 11 and the interposer 20A together. With this configuration, the semiconductor chip 11 can be more firmly attached to the interposer 20A and hence the reliability of the semiconductor device 10A is increased.

Directing attention then to electrical connection between the electrodes 13 and the post electrodes 22A, the post electrodes 22A are disposed inside the corresponding through holes 31A formed in the interposer base 21A as mentioned above.

In the related art, as described above, for electrically connecting semiconductor chips to interposers, the semiconductor chips on which solder bumps are formed are mounted on the interposers by flip chip technology.

On the other hand, in the present invention, the post electrodes 22A are formed directly on the corresponding electrodes 13 (more specifically, barrier metal portions 14) of the semiconductor chip 11. In other words, in the semiconductor device 10A of this embodiment, the post electrodes 22A are formed on the electrodes 13 by a direct plating method or the like (described below), and no conductive elements such as solder bumps are interposed between the post electrodes 22A and the electrodes 13.

Since bumps and underfill resin that are necessary for the related-art semiconductor devices are not necessary for the semiconductor device 10A, the number of component parts can be reduced. Moreover, since bumps and underfill resin are not needed, the thickness of the semiconductor device 10A can be reduced. Compared to the connection structure using bumps, since the pitch between the adjacent post electrodes 22A can be reduced, the density of the semiconductor device 10A can be increased.

The following describes a method of manufacturing the semiconductor device 10A having the above-described configuration. FIGS. 2A-4D are diagrams for explaining the method of manufacturing the semiconductor device 10A. In FIGS. 2A-4D, elements identical to those in FIG. 1 bear the same reference numbers and are not further described.

Figure 2A:
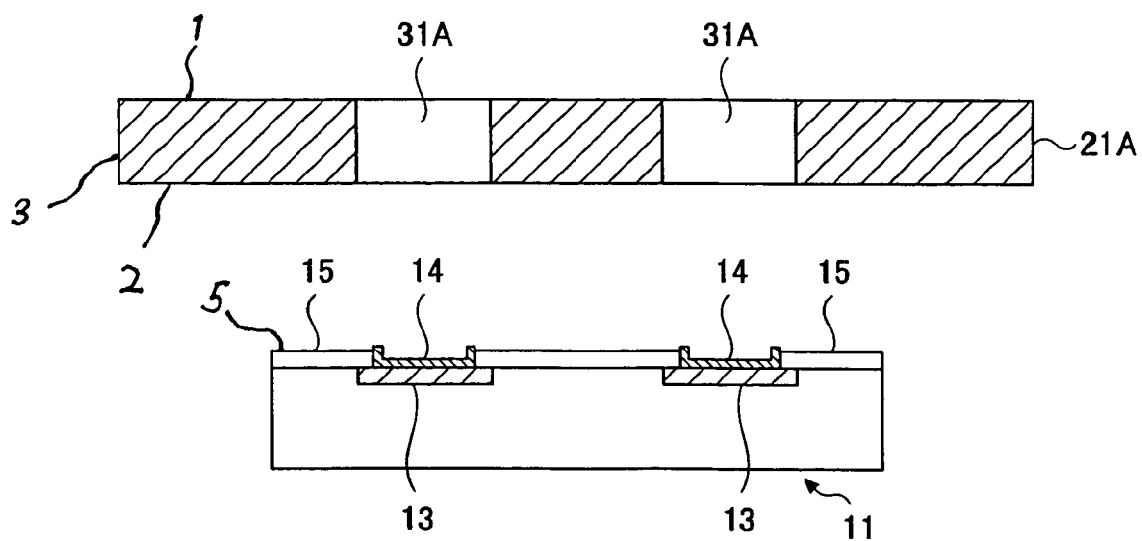
FIG. 2A is a diagram for explaining a method of manufacturing the semiconductor device of the first embodiment.
Figure 2B:
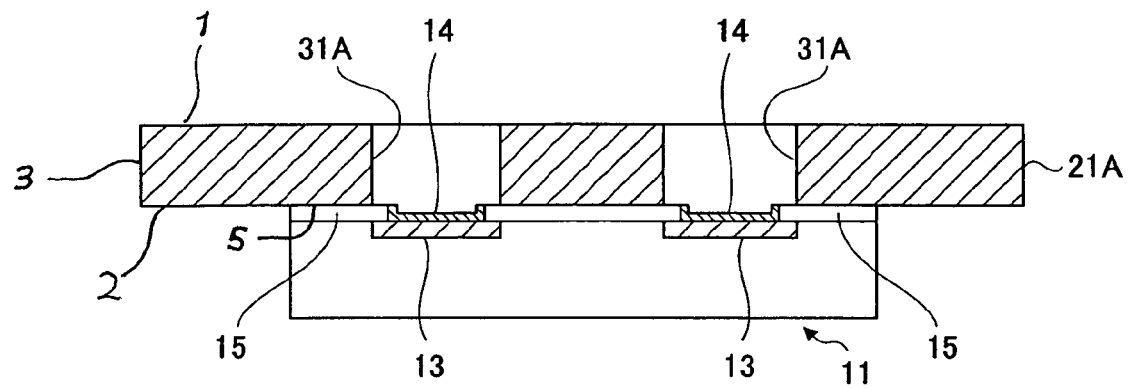
FIG. 2B (continued from FIG. 2A) is a diagram for explaining the method of manufacturing the semiconductor device of the first embodiment.

For manufacturing the semiconductor device 10A, the semiconductor chip 11 and the interposer base 21A as shown in FIG. 2A are prepared. The semiconductor chip 11 is manufactured with any known semiconductor manufacturing process, and comprises the electrodes 13, which are protected by the barrier metal portions 14, on the circuit forming surface side (upper surface side in FIG. 2A).

The circuit forming surface is covered with the insulation film 15 made of $SiO_2$ except where the electrodes 13 are formed. The electronic circuit formed on the circuit forming surface is protected by the insulation film 15. At least the portion of the insulation film 15 to be joined to the interposer base 21A is highly smoothened.

The interposer base 21A is a piece that is cut out from a silicon wafer. The interposer base 21A is defined by an upper principal surface 1, a lower principal surface 2, and a sidewall surface connecting the upper principal surface 1 to the lower principal surface 2. The through holes 31A are formed in positions in the interposer base 21A corresponding to the electrodes 13 of the semiconductor chip 11. As shown in FIG. 2A, the through holes extend between the upper and lower principal surfaces 1 and 2 of the interposer base 21A. The cross section of each through hole 31A is larger than the area of each electrode 13. An $SiO_2$ film (not shown) as a protective film is formed on the entire surface of the interposer base 21A.

At least the portion of the surface of the interposer base 21A to be joined to the semiconductor chip 11 is highly smoothened. There are various methods for smoothing the joint areas of the semiconductor chip 11 and the interposer base 21A. Examples of relatively inexpensive smoothing methods include grinding methods such as wrapping. For forming highly smooth surfaces, CMP (chemical mechanical polishing) and dry etching may be employed.

The semiconductor chip 11 and the interposer base 21A configured as described above are put inside a vacuum unit. The through holes 31A and the electrodes 13 are positioned. Then, with reference to FIG. 2B, the smooth surfaces (mirror surfaces) of the semiconductor chip 11 and the interposer base 21A are brought into contact with and pressed against each other. The smooth surfaces are thus put in tight contact with each other to be integrated with each other without using adhesive or the like. As a result, the semiconductor chip 11 and the interposer base 21A are firmly joined together (joining process) with the top principal surface 5 of the semiconductor chip 11 being in direct contact with the lower principal surface of the interposer base 21A.

Figure 2C:
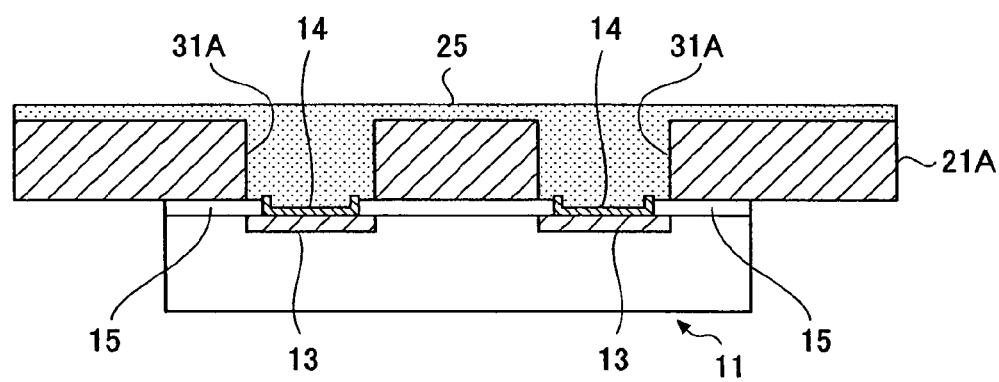
FIG. 2C (continued) is a diagram for explaining the method of manufacturing the semiconductor device of the first embodiment.

After the joining process is completed, a post electrode forming process is performed for forming the post electrodes 22A inside the corresponding through holes 31A and directly on the corresponding electrodes 13 (barrier metal portions 14) of the semiconductor chip 11. In the post electrode forming process, as shown in FIG. 2C, the first insulation layer 25 is formed to seal the through holes 31A and to cover the upper surface of the interposer base 21A. The first insulation layer 25 is made of polyimide resin, and can be formed on the interposer base 21A using a spinner method or a potting method.

Figure 3A:
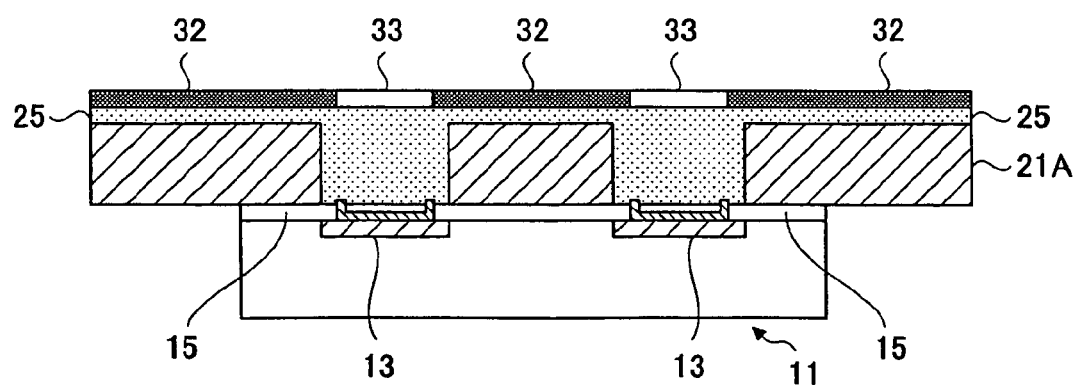
FIG. 3A (continued) is a diagram for explaining the method of manufacturing the semiconductor device of the first embodiment.
Figure 3B:
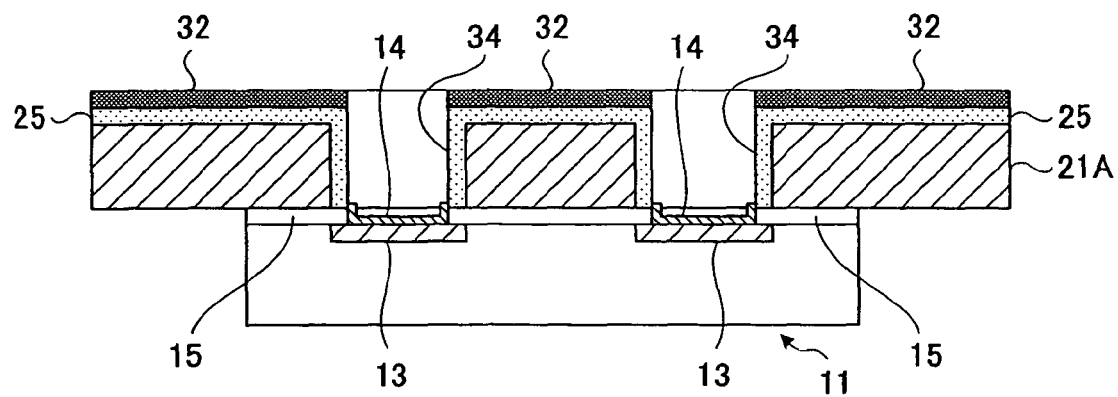
FIG. 3B (continued) is a diagram for explaining the method of manufacturing the semiconductor device of the first embodiment.

After the first insulation layer 25 is formed, as shown in FIG. 3A, a first resist 32 having openings 33 in predetermined positions is formed on the upper side of the first insulation layer 25. Then, the first insulation layer 25 is removed using the first resist 32 as a mask. With this removing process, as shown in FIG. 3B, electrode holes 34 are formed, at the bottom of which the barrier metal portions 14 are exposed.

Figure 3C:
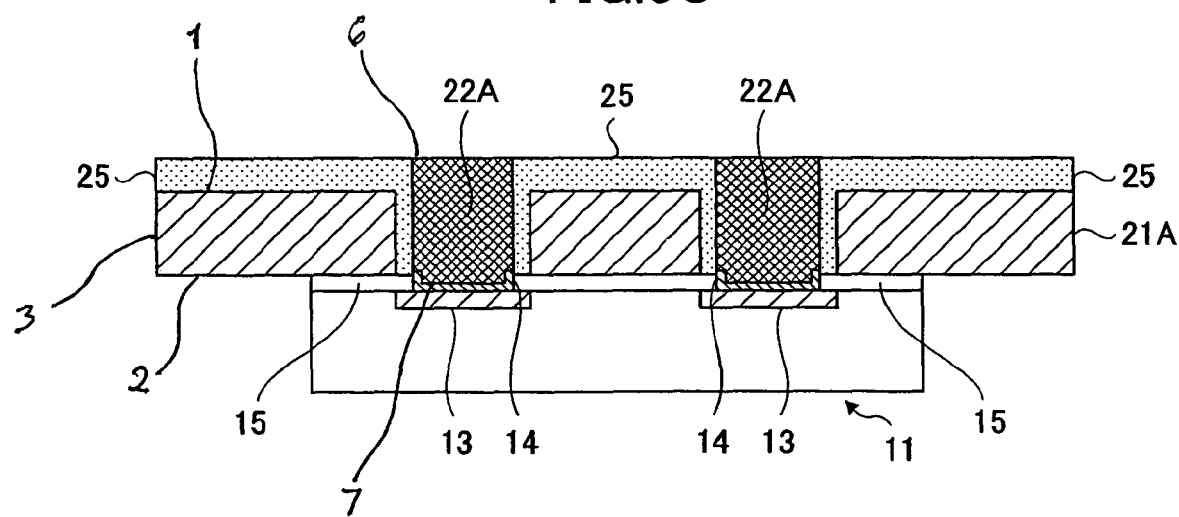
FIG. 3C (continued) is a diagram for explaining the method of manufacturing the semiconductor device of the first embodiment.

Then, copper plating is applied to the inside of the electrode holes 34 so as to form the post electrodes 22A inside the electrode holes 34 as shown in FIG. 3C. The post electrodes 22a have a top end 6 exposed at the upper principal surface 1 and a bottom end 7 exposed at the bottom principal surface 2. Since the post electrodes 22A are formed by depositing copper directly on the barrier metal portions 14, the post electrodes 22A are formed directly on the barrier metal portions 14 (i.e. electrodes 13). It is to be noted that the post electrodes 22A can be formed by either electrolytic plating or nonelectrolytic plating.

Figure 4A:
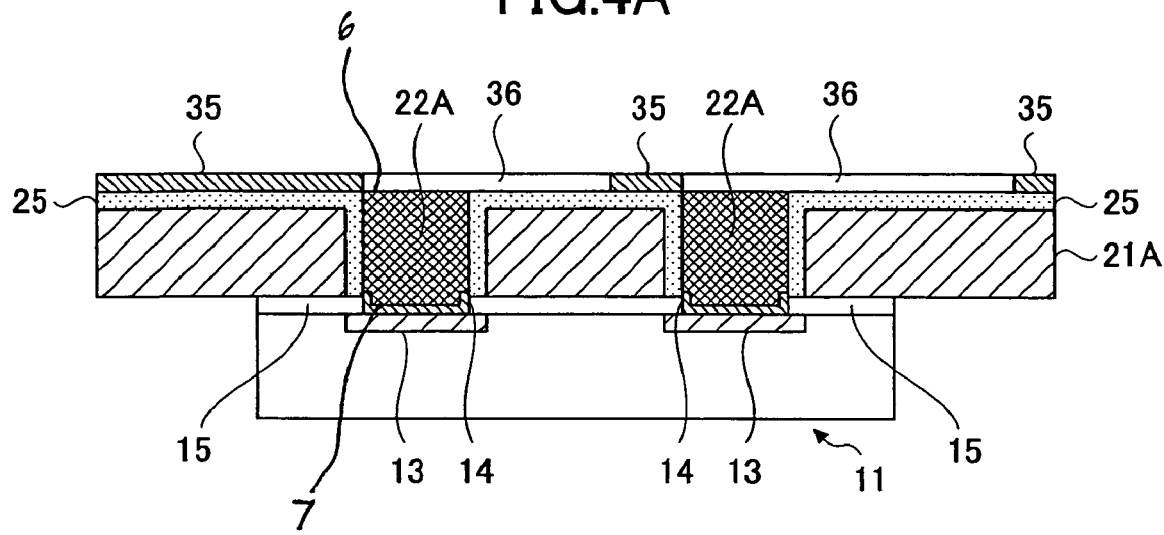
FIG. 4A (continued) is a diagram for explaining the method of manufacturing the semiconductor device of the first embodiment.

After the post electrode forming process is completed, a rewiring forming process for forming the rewiring layers 23 is performed. In the rewiring forming process, as shown in FIG. 4A, a second resist 35 is formed that has openings 36 in positions where the rewiring layers 23 are to be formed. The second resist 35 is formed by applying a photoresist material onto the interposer base 21A and then performing exposure and development processes.

Figure 4B:
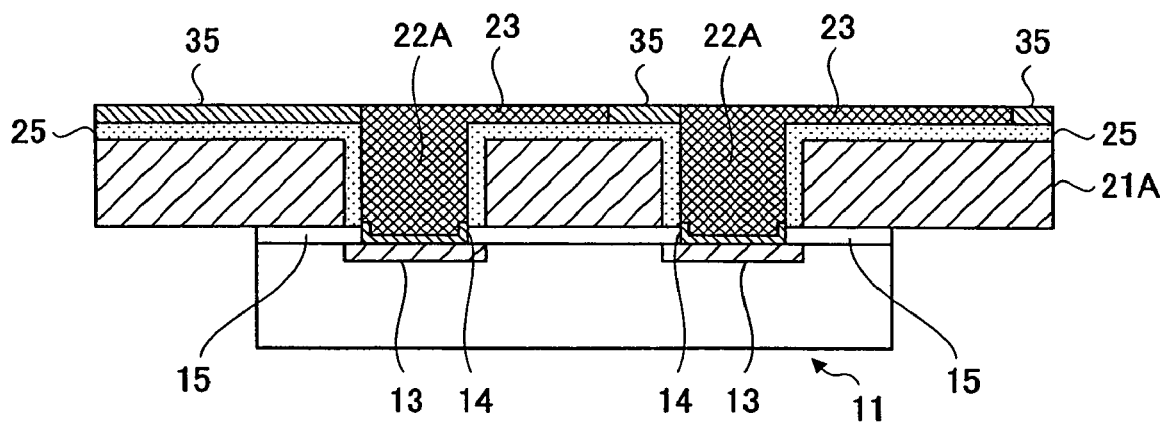
FIG. 4B (continued) is a diagram for explaining the method of manufacturing the semiconductor device of the first embodiment.

After the second resist 35 is formed, copper plating is applied to the inside of the openings 36. Thus, as shown in FIG. 4B, the rewiring layers 23 are formed inside the openings 36. Since the rewiring layers 23 are formed directly on the upper ends (i.e., top ends 6) of the post electrodes 22A, good electrical connections are established between the post electrodes 22A and the rewiring layers 23. It is to be noted that the rewiring layers 23 can also be formed by either electrolytic plating or nonelectrolytic plating.

After the rewiring forming process is completed, an external connection electrode forming process for forming the external connection terminals 24 on the rewiring layers 23 is performed. In the external connection terminal forming process, the second resist 35 is removed, and then the second insulation layer 26 is formed on the upper side of the first insulation layer 25 exposed by the removal of the second resist 35 and on the upper side of the rewiring layers 23. The second insulation layer 26 is made of the same polyimide resin as the first insulation layer 25.

As shown in FIG. 4C, openings 37 are formed in predetermined positions in the first insulation layer 26 corresponding to the rewiring layers 23. While each opening 37 is formed on an end of the corresponding rewiring layer 23 opposite to the end connected to the post electrode 22A, the opening 37 may be formed in an arbitrary position. It is to be noted that the openings 37 can be formed by etching, laser processing, or the like.

Referring to FIG. 4D, the external connection terminals 24 formed of solder balls are disposed in the openings 37 and joined to the rewiring layers 23 by heat treatment. With the above-described processes, the semiconductor device 10A shown in FIG. 1 is manufactured.

According to the above-described manufacturing method, the semiconductor chip 11 and the interposer base 21A are integrated with each other by being brought into direct contact with each other in the integrating process. Therefore, bumps and underfill resin that are necessary for joining the semiconductor chip 11 and the interposer 20A together with the related art methods are not necessary, so that the manufacturing process can be simplified.

In the post electrode forming process performed after the integrating process, the post electrodes 22A are formed inside the through holes 31A. Since these post electrodes 22A are formed directly on the barrier metal portions 14 (electrodes 13) of the semiconductor chip 11, impedance between the semiconductor chip 11 and the interposer 20A can be reduced, thereby improving electrical properties. Moreover, since the post electrodes 22A are formed using the through holes 31A (on whose inner surface the first insulation layer 25 is actually formed) formed in the interposer base 21A as molds, the post electrodes 22A can be easily formed.

While the joint portions of the semiconductor chip 11 and the interposer base 21A are made of the same material ($SiO_2$), the joint portions of the semiconductor chip 11 and the interposer base 21A are not necessarily made of the same material. For example, an interposer base 21A made of Si without the $SiO_2$ film can be joined to the insulation film 15 by just being brought into contact with the insulation film 15 as long as the joint areas of the interposer base 21A and the insulation film 15 have smooth surfaces.

Figure 5:
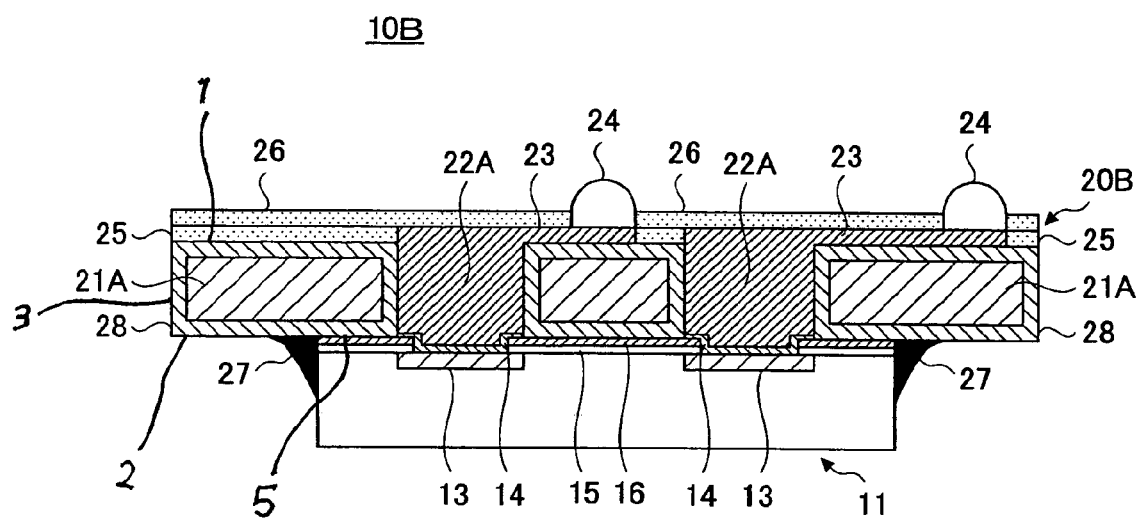
FIG. 5 is a cross-sectional view showing a semiconductor device according to a second embodiment of the present invention.
Figure 6A:
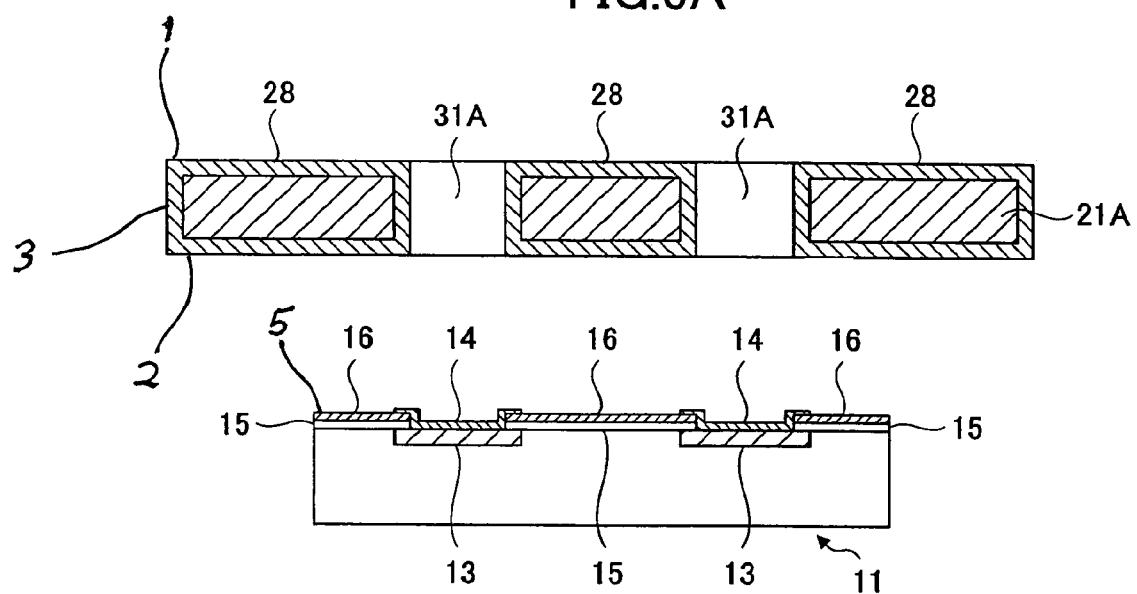
FIG. 6A is a diagram for explaining a method of manufacturing the semiconductor device of the second embodiment.
Figure 6B:
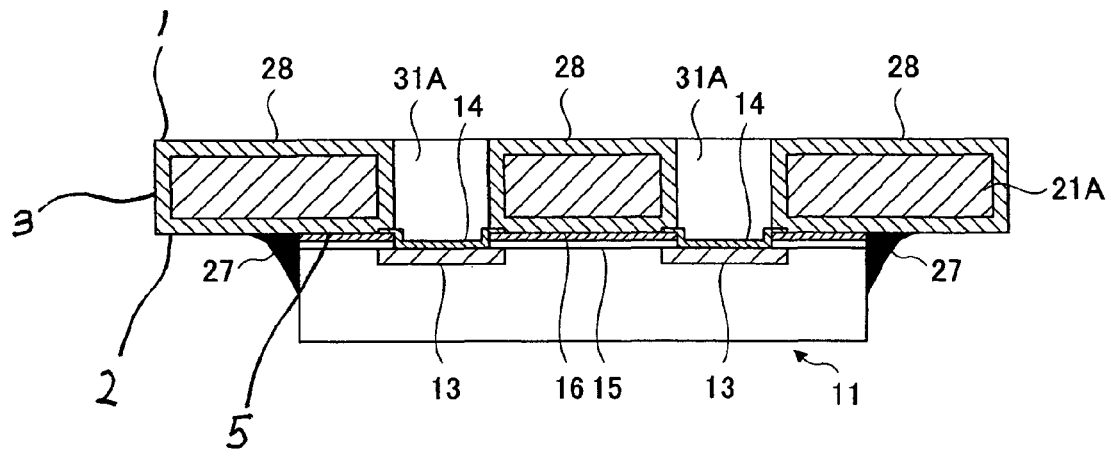
FIG. 6B (continued from FIG. 6A) is a diagram for explaining the method of manufacturing the semiconductor device of the second embodiment.

The following describes a second embodiment of the present invention. FIG. 5 shows a semiconductor device 10B of the second embodiment. FIGS. 6A and 6B are diagrams for explaining a method of manufacturing the semiconductor device 10B (only an integrating process is illustrated). In FIG. 5, elements identical to those in FIGS. 1-4D bear the same reference numbers and are not further described. This applies to elements shown in FIG. 6A and the figures that follow to be referred to in the following description.

The semiconductor device 10B of this embodiment is characterized in that a chip-side polyimide film 16 (corresponding to a first insulation layer in the appended claims, hereinafter referred to as a chip-side PI film 16) is formed on the surface of an insulation film 15 formed on a semiconductor chip 11, and that an interposer-side polyimide film 28 (corresponding to a second insulation layer in the appended claims, hereinafter referred to as an interposer-side PI film 28) is formed on the outer surface of an interposer base 21A of an interposer 20B.

In this embodiment, the chip-side PI film 16 is formed on the entire surface of the insulation film 15 (except where electrodes 13 are formed), and the interposer-side PI film 28 is formed on the entire outer surface of the interposer base 21A. The PI films 16 and 28 do not have to be formed on the entire outer surfaces of the insulation film 15 and the interposer base 21A and only need to be formed at least on joint portions of the semiconductor chip 11 and the interposer base 21A that are to be joined together.

The chip-side PI film 16 and the interposer-side PI film 28 on the joint portions of the semiconductor chip 11 and the interposer base 21A have smooth surfaces that are highly smoothened. In this embodiment, the semiconductor chip 11 and the interposer base 21A are joined together by bringing the chip-side PI film 16 formed on the semiconductor chip 11 and the interposer-side PI film 28 formed on the interposer base 21A into contact with each other.

That is, according to the method of manufacturing the semiconductor device 10B, when performing the integrating process, the chip-side PI film 16 and the interposer-side PI film 28 are formed in advance on the insulation film 15 formed on the semiconductor chip 11 and on the surface (the entire outer surface in this embodiment) of the interposer base 21A, respectively, as shown in FIG. 6A. Then, the semiconductor chip 11 and the interposer base 21A configured as described above are placed in a vacuum unit, and smooth surfaces (mirror surfaces) of the semiconductor chip 11 and the interposer base 21A are brought into contact with and pressed against each other in a predetermined vacuum environment.

The smooth surfaces are thus put in tight contact with each other as shown in FIG. 6B and integrated with each other without using adhesive or the like. As a result, the semiconductor chip 11 and the interposer base 21A are securely joined together, and the lower principal surface 2 of the interposer base 21A is in direct contact with the top principal surface 5 of the semiconductor chip 11. As can be seen, even if the surfaces of the semiconductor chip 11 and the interposer base 21A are covered with the corresponding PI films (resin films) 16 and 28, the semiconductor chip 11 and the interposer base 21A can be joined together without using adhesive or the like by just being brought into contact with and pressed against each other.

If the PI films 16 and 28 are formed only on the corresponding joint portions of the semiconductor chip 11 and the interposer base 21A, the areas to be highly smoothened can be reduced. Therefore, process of smoothing the surfaces of the PI films 16 and 28 can be facilitated. On the other hand, if the PI films 16 and 28 are formed on the corresponding entire outer surfaces of the semiconductor chip 11 and the interposer base 21A, the PI films 16 and 28 serve as protective layers for protecting the semiconductor chip 11 and the interposer base 21A.

The processes to be performed after the integrating process are the same as those described with reference to FIGS. 2A-4D, and are not described herein.

Figure 7:
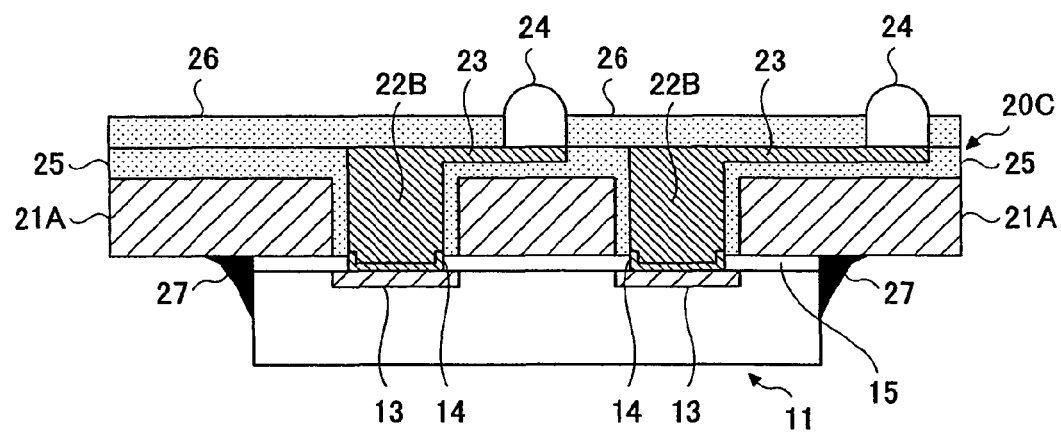
FIG. 7 is a cross-sectional view showing a semiconductor device according to a third embodiment of the present invention.
Figure 8A:
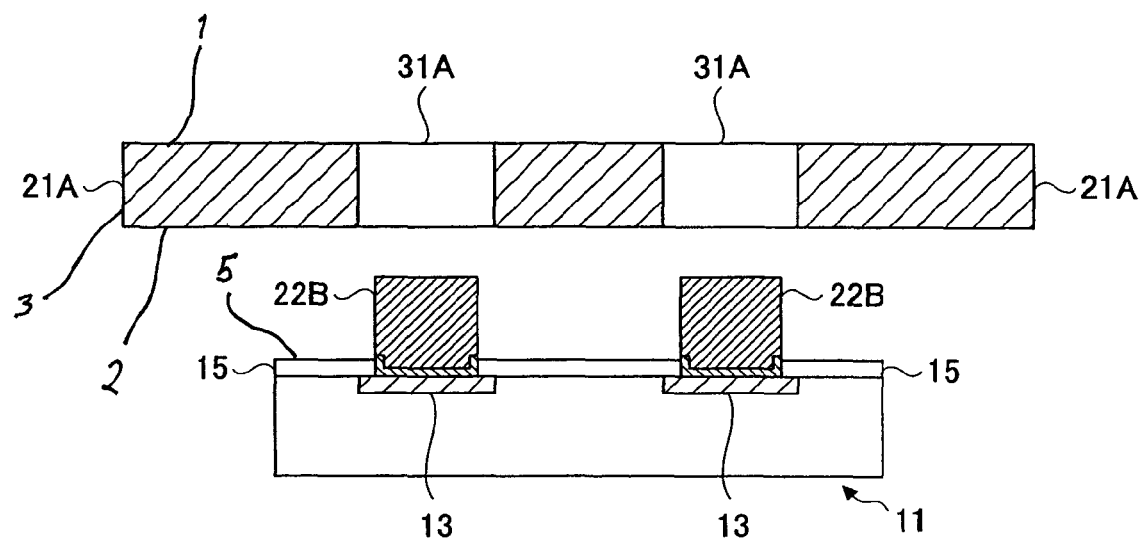
FIG. 8A is a diagram for explaining a method of manufacturing the semiconductor device of the third embodiment.
Figure 8B:
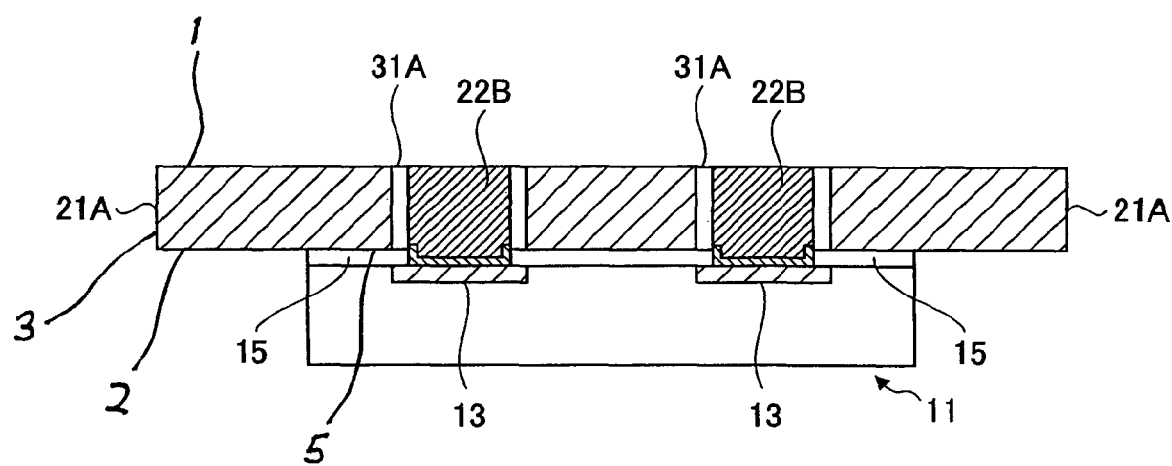
FIG. 8B (continued from FIG. 8A) is a diagram for explaining the method of manufacturing the semiconductor device of the third embodiment.

The following describes a third embodiment of the present invention. FIG. 7 shows a semiconductor device 10C of the third embodiment. FIGS. 8A-8C are diagrams for explaining a method of manufacturing the semiconductor device 10C (only a post electrode forming process and an integrating process are illustrated).

The semiconductor device 10C of this embodiment is characterized in that the post electrode forming process is performed before the integrating process. That is, in the manufacturing processes of the semiconductor device 10C, post electrodes 22B are formed directly on electrodes 13 (barrier metal portions 14) of a semiconductor chip 11, and then the semiconductor chip 11 on which the post electrodes 22B are formed is directly joined to an interposer base 21A.

The following method shown in FIG. 8A may be used for forming the post electrodes 22B, for example. First, a photosensitive dry film is attached to a circuit forming surface of the semiconductor chip 11. The thickness of the dry film is equal to the height of the post electrodes 22B. The dry film is then exposed and developed, so that through holes are formed in positions where the post electrodes 22B are to be formed.

Barrier metal portions 14 are exposed at the bottom of the through holes. Then, copper plating is performed to form the post electrodes 22B inside the through holes formed in the dry film. The post electrodes 22B are formed directly on the barrier metal portions 14 (electrodes 13). The dry film is then removed, so that the semiconductor chip 11 on which the post electrodes 22B are formed as shown in FIG. 8A is manufactured.

After the post electrode forming process is completed, the integrating process is performed. In the integrating process, the semiconductor chip 11 and the interposer base 21S are placed in a vacuum unit, and smooth surfaces (mirror surfaces) of the semiconductor chip 11 and the interposer base 21A are brought into contact with and pressed against each other in a predetermined vacuum environment. The smooth surfaces are thus put in tight contact with each other and integrated with each other without using adhesive or the like. As a result, as shown in FIG. 8B, the semiconductor chip 11 and the interposer base 21A are securely joined together, and the lower principal surface 2 of the interposer base 21A is in direct contact with the top principal surface 5 of the semiconductor chip 11.

When the semiconductor chip 11 and the interposer base 21A are integrated with each other, the post electrodes 22B are inserted in the through holes 31A formed in the interposer base 21A. The diameter of the post electrodes 22B is smaller than the diameter of the through holes 31A, and therefore gaps are formed between the outer circumferential surfaces of the post electrodes 22B and the inner circumferential surfaces of the through holes 31A.

After the integrating process is completed, a process of forming a first insulation layer 25 is performed. In this process, as shown in FIG. 8C, the gaps between the outer circumferential surfaces of the post electrodes 22B and the inner circumferential surfaces of the through holes 31A are filled with the first insulation layer 25. The processes to be performed after the process of forming the first insulation layer 25 are the same as those described with reference to FIGS. 2A-4D, and are not described herein.

According to the semiconductor device 10C and the method of manufacturing the semiconductor device 10C of this embodiment, the integrating process is performed after the post electrode forming process, and the post electrodes 22B can be formed without using the through holes 31A formed in the interposer base 21A. That is, unlike the method of manufacturing the semiconductor device 10A of the first embodiment, since the through holes 31A are not used as molds for forming the post electrodes 22B, the post electrodes 22B and the through holes 31A can be independently formed (although the diameter of the post electrodes 22B needs to be smaller than the diameter of the through holes 31A).

With the method of manufacturing the semiconductor device 10C of this embodiment, the through holes 31A can be formed easily compared to the manufacturing method of the first embodiment that forms the post electrodes 22A using the through holes 31A formed in the interposer base 21A.

According to the manufacturing method of the first embodiment, since the post electrodes 22A are formed using the through holes 31A as molds, the diameter of the through holes 31A defines the diameter of the post electrodes 22A.

A common method of forming holes in the interposer base 21A is laser beam drilling or mechanical processing. On the other hand, in this embodiment, the through holes for forming the post electrodes 22B are formed by exposing and developing the photosensitive dry film. This allows reducing the size of the through holes. Accordingly, post electrodes 22B can be arranged at smaller pitches, so that the density of the semiconductor device 10C can be increased.

Figure 10A:
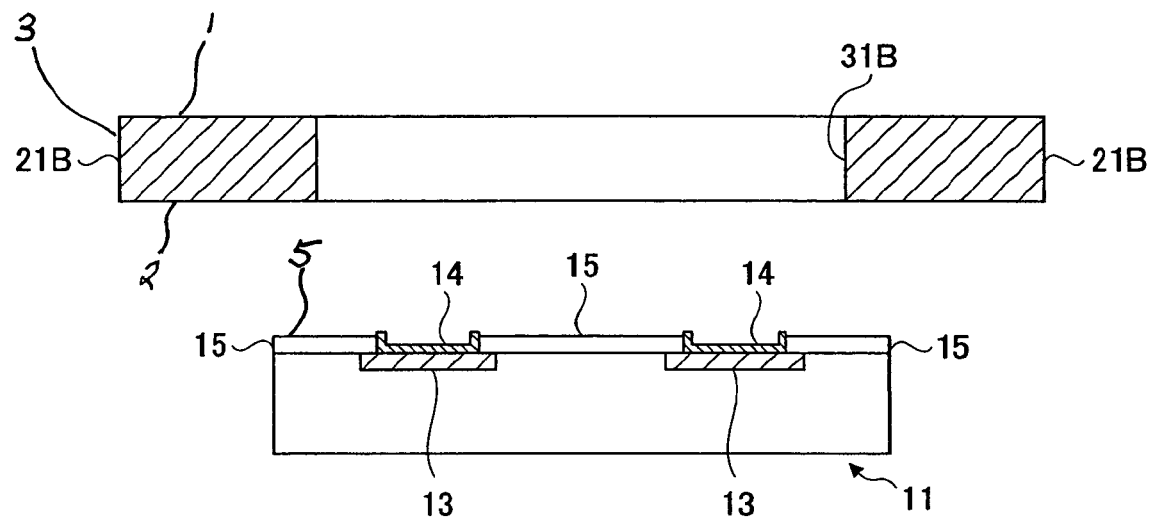
FIG. 10A is a diagram for explaining a method of manufacturing the semiconductor device of the fourth embodiment.
Figure 10B:
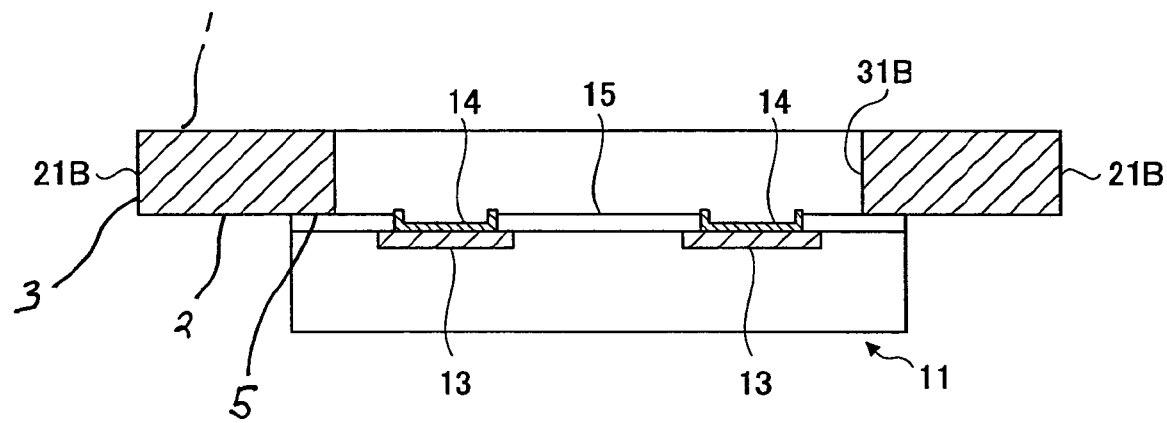
FIG. 10B (continued from FIG. 10A) is a diagram for explaining the method of manufacturing the semiconductor device of the fourth embodiment.

The following describes a fourth embodiment of the present invention. FIG. 9 shows a semiconductor device 10D of the fourth embodiment. FIGS. 10A and 10B are diagrams for explaining a method of manufacturing the semiconductor device 10D (only an integrating process is illustrated).

The semiconductor device 10D of this embodiment is characterized in that plural post electrodes 22A (only two post electrodes 22A are shown in FIG. 9) are disposed in one through hole 31B. As shown in FIG. 10A, the through hole 31B formed in an interposer base 21B has a greater area than the area of the through hole 31A in the first-third embodiments. In the integrating process, as shown in FIG. 10B, the portion of the interposer base 21B around the through hole 31B is directly joined to the semiconductor chip 11, so that the lower principal surface 2 of the interposer base 21B is in direct contact with the top principal surface 5 of the semiconductor chip 11.

With the configuration of this embodiment, since the plural post electrodes 22A are disposed in one through hole 31B, the through hole 31B can be formed with a lower accuracy than the post electrodes 22A. Therefore, the through hole 31B can be formed easily.

Figure 11:
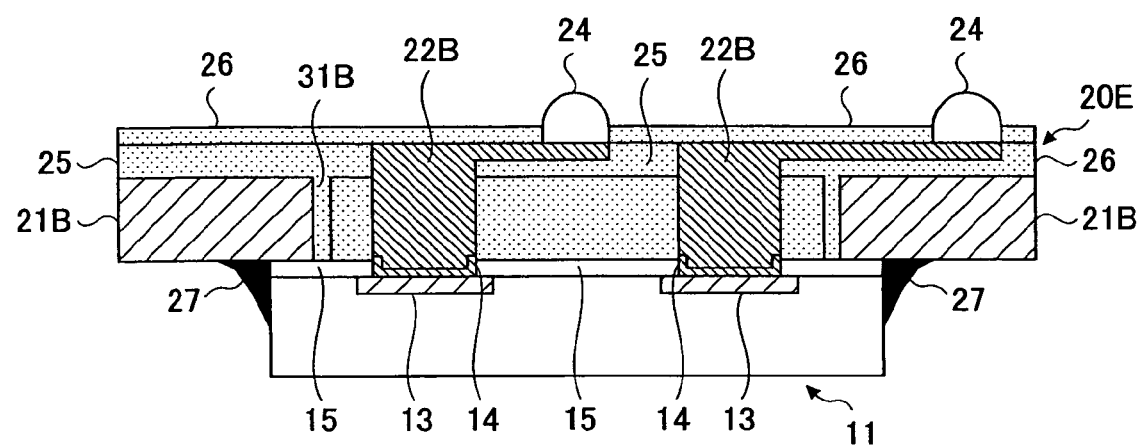
FIG. 11 is a cross-sectional view showing a semiconductor device according to a fifth embodiment of the present invention.
Figure 12A:
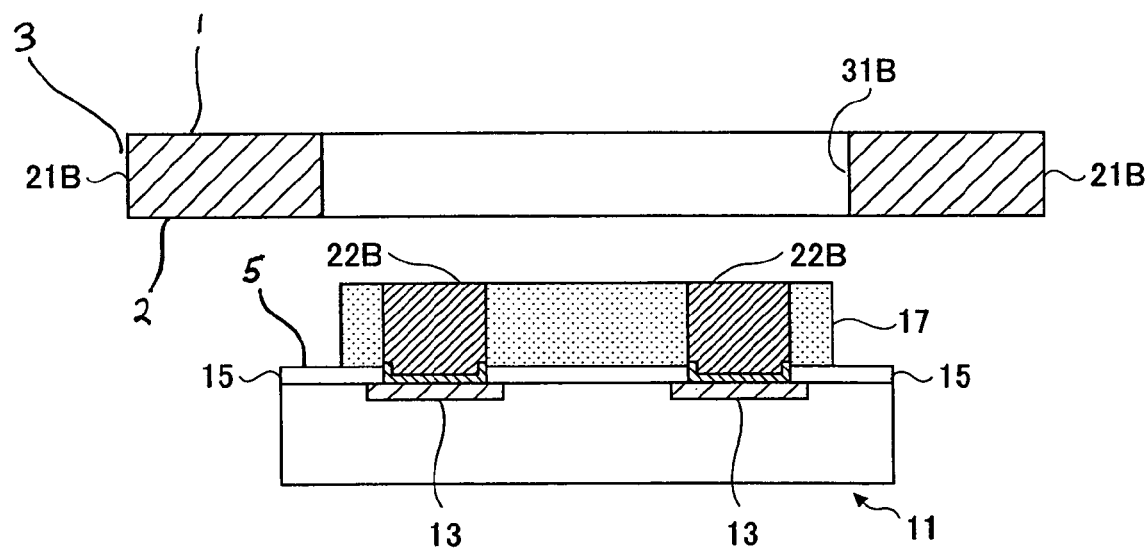
FIG. 12A is a diagram for explaining a method of manufacturing the semiconductor device of the fifth embodiment.
Figure 12B:
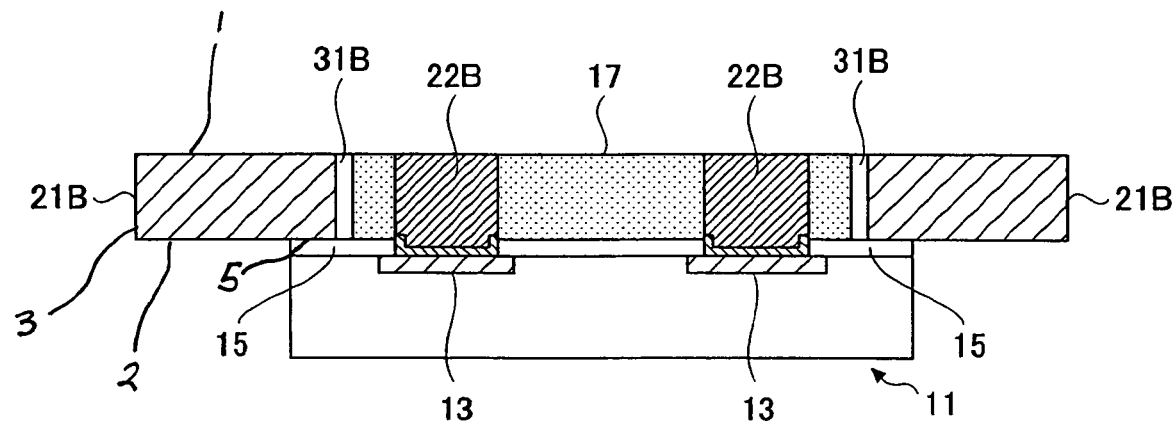
FIG. 12B (continued from FIG. 12A) is a diagram for explaining the method of manufacturing the semiconductor device of the fifth embodiment.
Figure 12C:
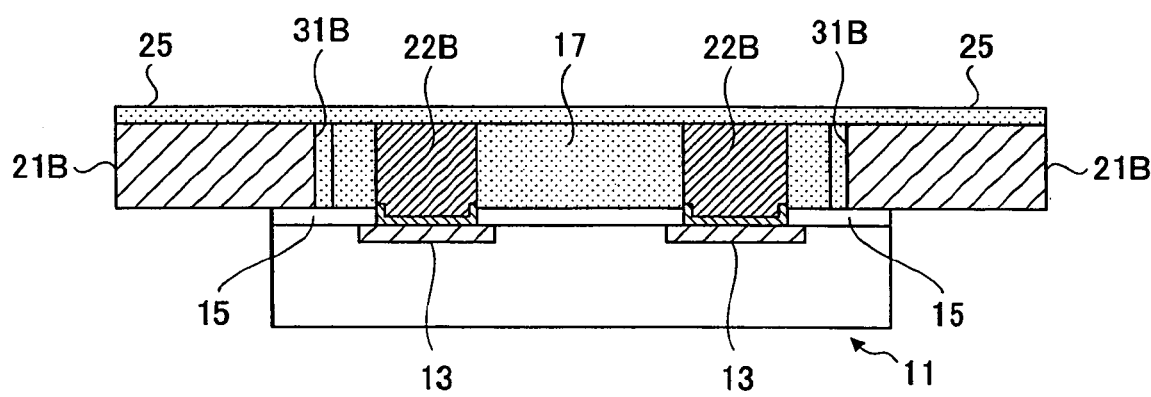
FIG. 12C (continued) is a diagram for explaining the method of manufacturing the semiconductor device of the fifth embodiment.

The following describes a fifth embodiment of the present invention. FIG. 11 shows a semiconductor device 10E of the fifth embodiment. FIGS. 12A-12C are diagrams for explaining a method of manufacturing the semiconductor device 10E (only a post electrode forming process and an integrating process are illustrated).

As in the case of the semiconductor device 10D of the fourth embodiment, the semiconductor device 10E of this embodiment is configured such that plural post electrodes 22B are disposed in one through hole 31B. The post electrodes 22B are formed directly on barrier metal portions 14 (electrodes 13).

As in the case of the third embodiment, the post electrodes 22B are formed using a photosensitive dry film, and the process of forming the post electrodes 22B is performed before the integrating process. In addition, this embodiment is characterized in that, after the post electrodes 22B are formed on a semiconductor chip 11, a protective layer 17 for protecting the post electrodes 22B is formed.

The protective film 17 is made of an insulating material. In this embodiment, the dry film used for forming the post electrodes 22B is not removed but is used as the protective layer 17. This configuration can eliminates a step of removing the dry film, so that the manufacturing processes and the number of component parts are reduced compared to the configuration in which a separately prepared protective layer 17 is provided. It is to be noted that the method of forming the protective layer 17 is not limited to the one applied to the manufacturing method of this embodiment, and other methods (e.g. a method using resist or the like) may be used.

After the post electrode forming process for forming the post electrodes 22B and the protective layer forming process for forming the protective layer 17 are completed, the integrating process is performed. In this integrating process, smooth surfaces (mirror surfaces) of the semiconductor chip 11 and an interposer base 21B are brought into contact with and pressed against each other in a predetermined vacuum environment (see FIG. 12A).

The smooth surfaces are thus put in tight contact with each other and integrated with each other without using adhesive or the like. As a result, as shown in FIG. 12B, the semiconductor chip 11 and the interposer base 21B are securely joined together, so that the lower principal surface 2 of the interposer base 21B is in direct contact with the top principal surface 5 of the semiconductor chip 11. In this joining state, a gap is formed between the outer circumferential surface of the protective layer 17 and the inner circumferential surface of the through hole 31B as shown in FIG. 12B.

After the integrating process is completed, a process of forming a first insulation layer 25 is performed. In this process, the gap between the outer circumferential surface of the protective layer 17 and the inner circumferential surface of the through hole 31B is filled with the first insulation layer 25. The processes to be performed after the process of forming the first insulation layer 25 are the same as those described with reference to FIGS. 2A-4D, and are not described herein.

As described above, in this embodiment, since the post electrodes 22B are held by the protective layer 17 made of an insulating material, the post electrodes 22B formed directly on the semiconductor chip 11 can be surely protected even if the size of the post electrodes 22B is reduced due to reduction of pitch. Moreover, the post electrodes 22B (especially the post electrodes 22B to be positioned near the inner circumferential surface of the through hole 31B) can be prevented from hitting the interposer base 21B and being damaged when the post electrodes 22B are inserted into the through hole 31B.

Figure 13:
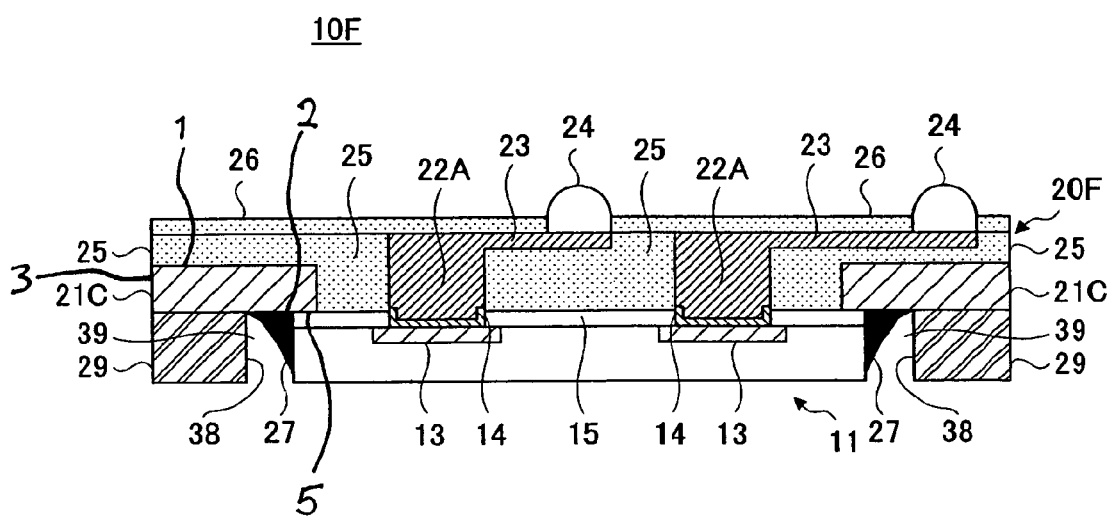
FIG. 13 is a cross-sectional view showing a semiconductor device according to a sixth embodiment of the present invention.
Figure 14:
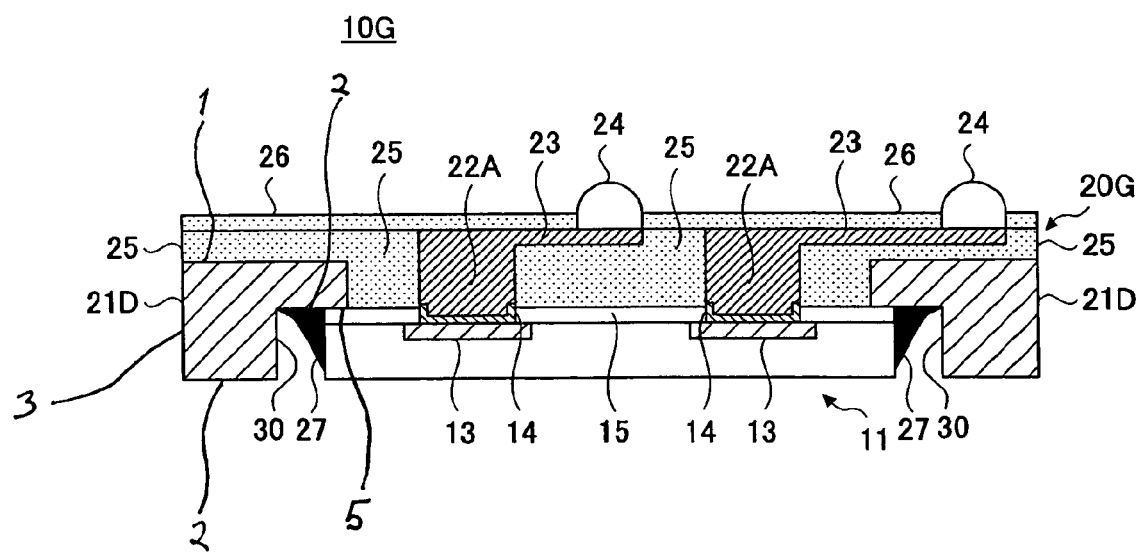
FIG. 14 is a cross-sectional view showing a semiconductor device according to a seventh embodiment of the present invention.
Figure 15:
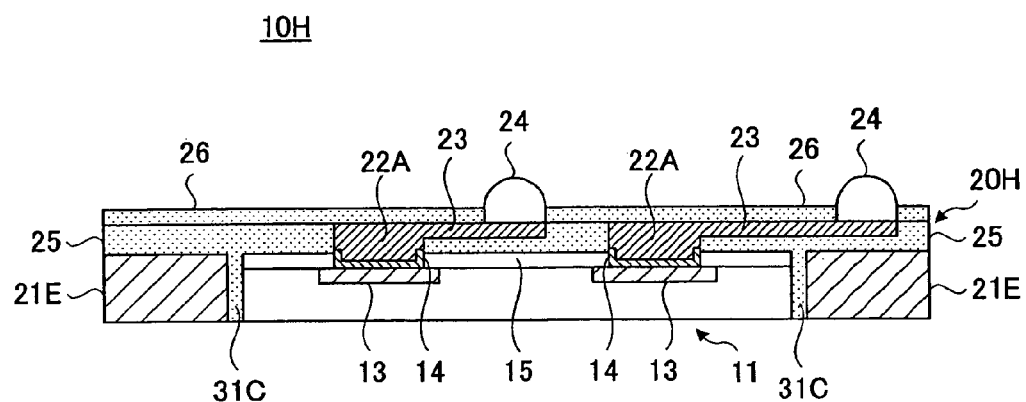
FIG. 15 is a cross-sectional view showing a semiconductor device according to an eighth embodiment of the present invention.

The following describes sixth-eighth embodiments of the present invention. FIG. 13 shows a semiconductor device 10F of the sixth embodiment. FIG. 14 shows a semiconductor device 10G of the seventh embodiment. FIG. 15 shows a semiconductor device 10H of the eighth embodiment. The semiconductor devices 10F-10H of these embodiments are configured to be reduced in thickness compared to the semiconductor devices 10A-10E of the above-described first-fifth embodiments.

The semiconductor device 10F shown in FIG. 13 is characterized in that an interposer 20F comprises an interposer base 21C and a reinforcing member 29. The interposer base 21C is thinner than the interposer bases 21A and 21B used in the semiconductor devices 10A-10E of the first-fifth embodiments. However, as the interposer base 21C is provided with the reinforcing member 29 serving as a stiffener, predetermined mechanical strength is maintained.

An opening 38 is formed at the center of the reinforcing member 29, and has an area greater than the area of a through hole 31B formed in the interposer base 21C and the area of a semiconductor chip 11. That is, when the semiconductor chip 11 is directly integrated with the interposer base 21C, the semiconductor chip 11 is accommodated in a recess 39 defined by the reinforcing member 29 and the interposer base 21C. With this configuration, since the semiconductor chip 11 can be accommodated in the recess 39 (recessed portion) formed in the interposer 20F, the thickness of the semiconductor device 10F can be reduced.

The semiconductor device 10G shown in FIG. 14 is characterized in that a recess 30 is directly formed in an interposer base 21D without separately providing a reinforcing member 29. Referring to the semiconductor device 10H shown in FIG. 15, the area of a through hole 31C formed in an interposer base 21E is greater than the area of a semiconductor chip 11 so as to accommodate the semiconductor chip 11 in the through hole 31C. In both cases of the semiconductor devices 10G and 10H, since a the semiconductor chips 11 are partly or completely accommodated in the height direction thereof in the interposer bases 21D and 21E, the thickness of the semiconductor devices 10G and 10H can be reduced.

Figure 16:
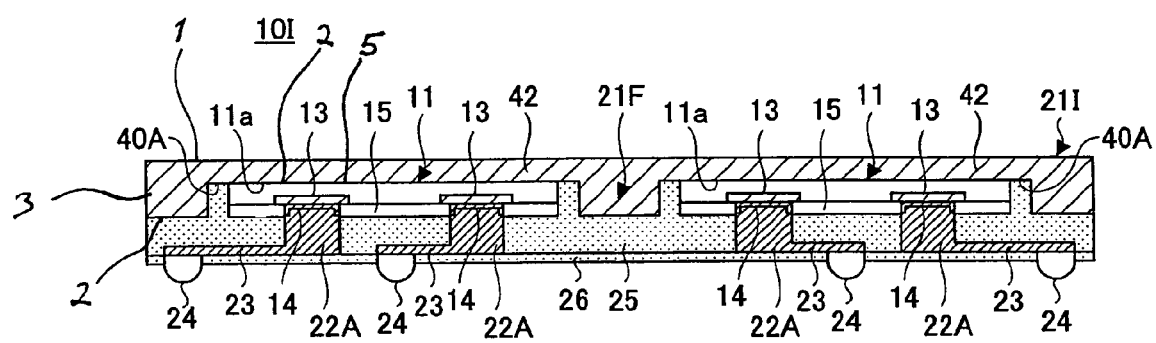
FIG. 16 is a cross-sectional view showing a semiconductor device according to a ninth embodiment of the present invention.
Figure 17:
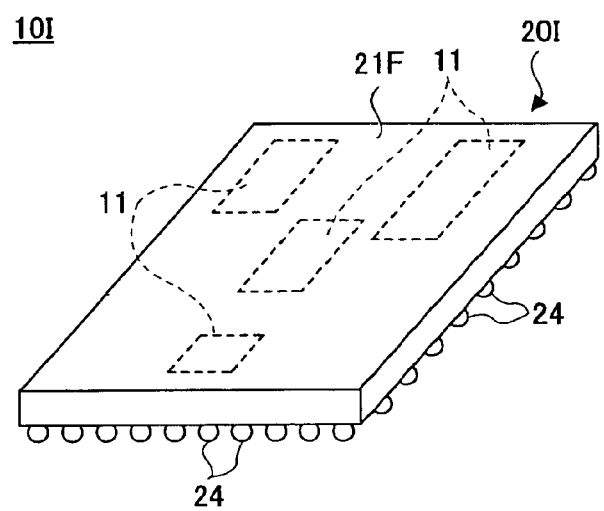
FIG. 17 is a perspective view showing the semiconductor device of the ninth embodiment of the present invention.
Figure 18:
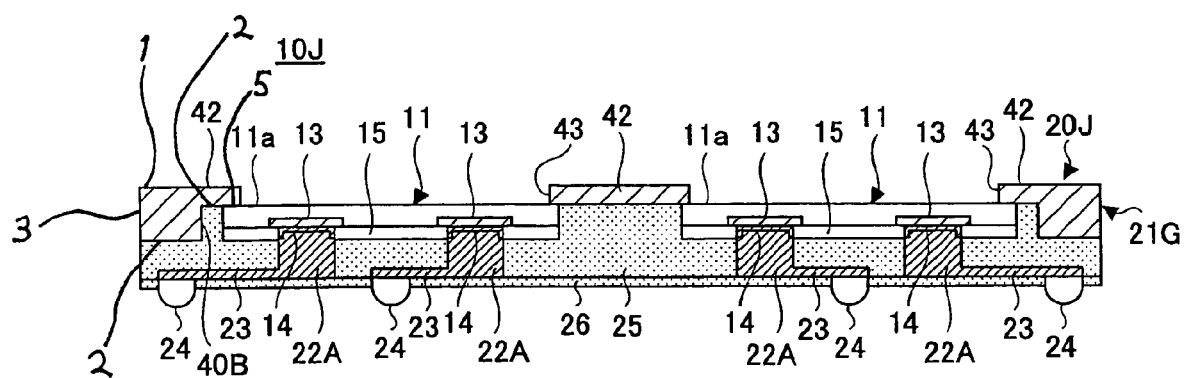
FIG. 18 is a cross-sectional view showing a semiconductor device according to a tenth embodiment of the present invention.
Figure 19:
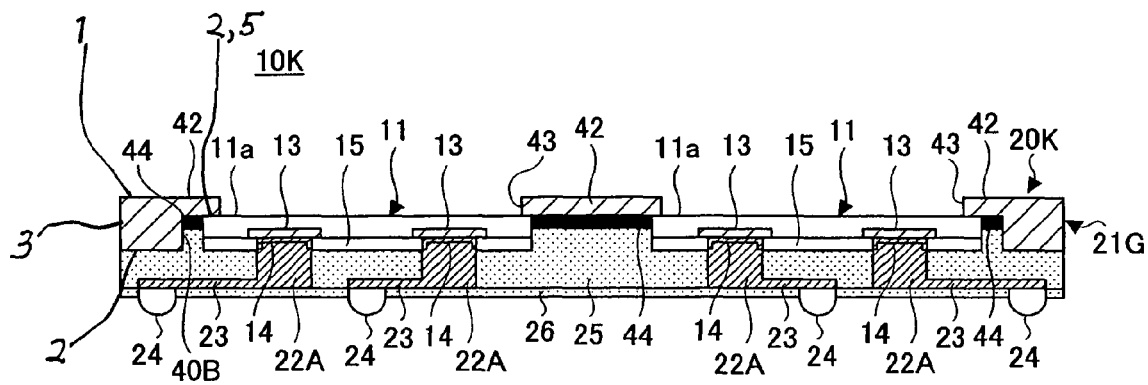
FIG. 19 is a cross-sectional view showing a semiconductor device according to an eleventh embodiment of the present invention.
Figure 20:
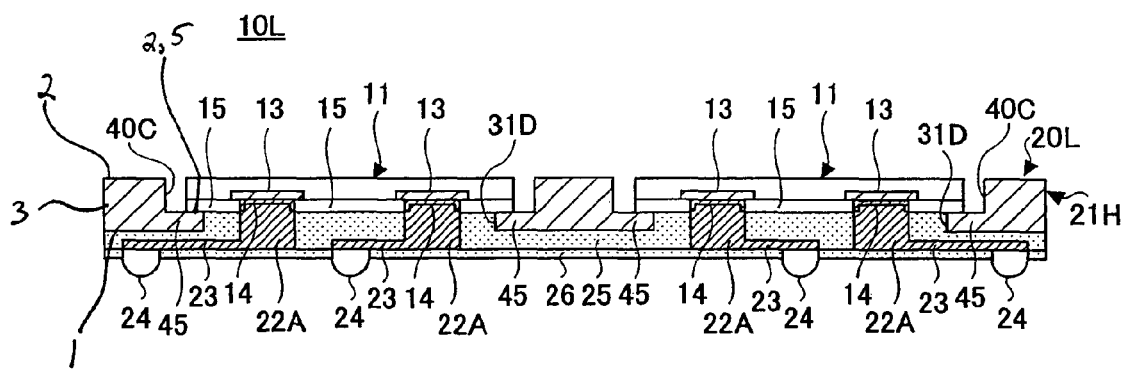
FIG. 20 is a cross-sectional view showing a semiconductor device according to a twelfth embodiment of the present invention.

The following describes ninth-twelfth embodiments of the present invention. FIGS. 16 and 17 show a semiconductor device 10I of the ninth embodiment of the present invention. FIG. 18 is a cross-sectional view showing a semiconductor device 10J of the tenth embodiment. FIG. 19 is a cross-sectional view showing a semiconductor device 10K of the eleventh embodiment. FIG. 20 is a cross-sectional view showing a semiconductor device 10L of the twelfth embodiment.

The semiconductor devices 10I-10L shown in FIGS. 16-20 are characterized in that plural semiconductor chips 11 are disposed on corresponding interposers 20I-21H. In FIG. 16 and the figures that follow, elements identical to those in FIGS. 1-4D bear the same reference numbers and are not further described.

The semiconductor device 10I shown in FIGS. 16 and 17, no through hole is formed in an interposer base 21F of the interposer 20I. Plural cavities 40A are formed from the lower surface of the interposer base 21F. The semiconductor chips 11 are joined to the top surfaces of the cavities 40A, so that the semiconductor chips 11 are disposed on the interposer 20I. With this configuration, the semiconductor chips 11 are hidden in a top plate section 42 of the interposer base 21F and cannot be seen from the outside of the semiconductor device 10I.

The semiconductor chips 11 are joined at back faces 11a thereof to the corresponding cavities 40A, so that the semiconductor chips 11 are secured to the interposer base 21F. As in the case of the above-described embodiments, the small base surface joining method is used for joining the semiconductor chips 11 and the interposer base 21F together so that the lower principal surface 2 of the interposer base 21F is in direct contact with the top principal surface 5 of the semiconductor chip 11.

The semiconductor chips 11 are joined to the interposer base 21F all at once. In other words, the semiconductor chips 11 are joined to the interposer base 21F by so-called batch processing. The process of joining the semiconductor chips 11 to the interposer base 21F can be thus efficiently performed.

When the small base surface joining method is used, the portions to be joined together are preferably made of the same material or the same type of material. In this embodiment, the interposer base 21F is made of silicon or glass. The semiconductor chips 11 and the interposer base 21F can be therefore joined more firmly, so that reliability of the semiconductor device 10I can be improved.

In the configuration in which plural semiconductor chips 11 are joined to one interposer base 21F, it is important that the semiconductor chips 11 are firmly joined to the interposer base 21F in terms of improving the reliability of the semiconductor device 10I. In this embodiment, since the entire surfaces of the back faces 11a of the semiconductor chips 11 are joined to the corresponding cavities 40A by small base surface joining, the size of the joining area between the semiconductor chips 11 and the interposer base 21F can be increased. Therefore, the semiconductor chips 11 are attached more firmly.

The semiconductor device 10J of the tenth embodiment shown in FIG. 18 is characterized in that a cavity 40B formed in the interposer base 21G from the lower surface thereof and that openings 43 are formed in predetermined portions of a top plate section 42 facing the semiconductor chips 11. In this embodiment, the top plate section 42 around the openings 43 are surface joined to back faces 11a of the semiconductor chips 11 by small base surface joining so that the lower principal surface 2 of the interposer base 21G is in direct contact with the top principal surface 5 of the semiconductor chip 11.

In this embodiment, since the openings 43 are formed in the interposer base 21G, the back faces 11a of the semiconductor chips 11 are exposed outside. With this configuration, heat generated by the semiconductor chips 11 can be efficiently released, thereby preventing the semiconductor chips 11 from malfunctioning and being damaged due to heat.

The semiconductor device 10K of the eleventh embodiment shown in FIG. 19 is characterized in that a cavity 40B are formed in the interposer base 21G from the lower surface thereof and that adhesive 44 is applied to a top plate section 42 except where openings 43 and the semiconductor chips 11 are disposed.

As in the case of the semiconductor device 10J of the tenth embodiment shown in FIG. 18, the semiconductor device 10K of this embodiment is configured such that the openings 43 are formed in positions on the top plate section 42 of the interposer base 21G facing back faces 11a of the semiconductor chips 11, and therefore heat releasing efficiency of the semiconductor chips 11 is increased. However, although the heat releasing efficiency is increased by forming the openings 43, the size of the joining area between the top plate section 42 and the semiconductor chips 11 is reduced. Accordingly, compared to the semiconductor device 10J shown in FIG. 18, the semiconductor chips 11 are less firmly joined to the interposer base 21G.

In view of that, in this embodiment, after the semiconductor chips 11 are joined to the interposer base 21G by small surface joining, the adhesive 44 is applied into the cavity 40B. The adhesive 44 is, for example, thermosetting resin, and once cured, has strength enough to protect the semiconductor chips 11. Therefore, in the semiconductor device 10K of this embodiment, mechanical strength of the semiconductor chips 11 against the interposer base 21G can be increased while maintaining high heat releasing efficiency of the semiconductor chips 11.

The semiconductor device 10L of the twelfth embodiment shown in FIG. 20 is configured such that plural cavities 40C are formed in the interposer base 21H from the upper surface thereof, and a through hole 31D is formed in a bottom plate section 45 of each cavity 40C. An insulation film 15 of the semiconductor chip 11 is joined to the bottom plate section 45 around the through hole 31D by small base surface joining, and thus secured to the interposer base 21H. Thus, in this embodiment the upper surface of interposer base 21H corresponds to the lower principal surface 2 and the surface of the semiconductor chip 11 on which the electrodes 13 are formed in the semiconductor chip's top principal surface 5. Accordingly, the lower principal surface 2 of the interposer base 21G is in direct contact with the top principal surface 5 of the semiconductor chip 11. Post electrodes 22A are configured to extend through the corresponding through holes 31D to the lower surface side of the interposer base 21H.

The depth of the cavities 40C is equal to the thickness of the semiconductor chips 11. Accordingly, when the semiconductor chips 11 are joined to the interposer base 21H, the semiconductor chips 11 are located inside the interposer base 21H. The height of the semiconductor chips 11 and insulation layers 25 and 26 projecting outside the interposer base 21H is thus reduced, so that the thickness of the semiconductor device 10L can be reduced.

Figure 21:
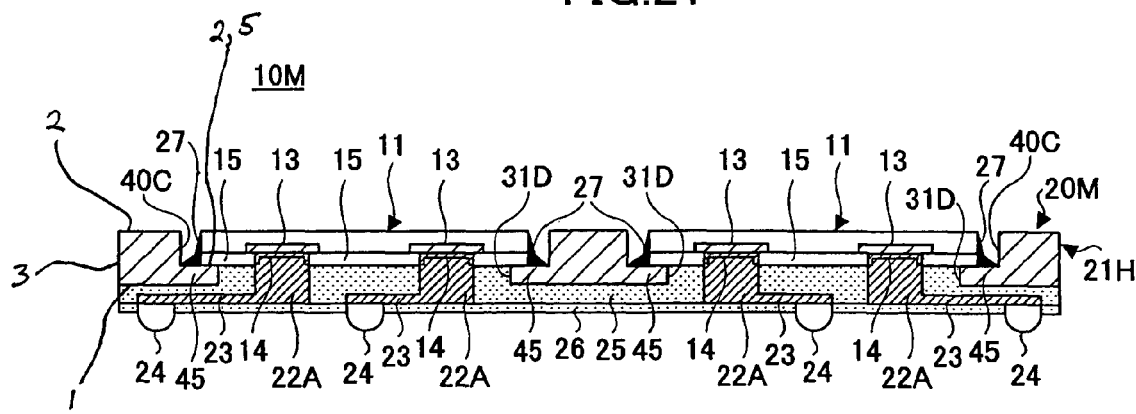
FIG. 21 is a cross-sectional view showing a semiconductor device according to a thirteenth embodiment of the present invention.
Figure 22:
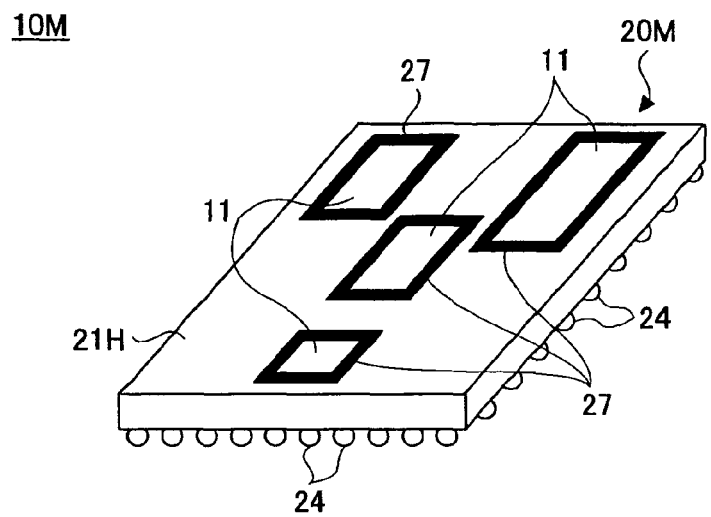
FIG. 22 is a perspective view showing the semiconductor device of the thirteenth embodiment of the present invention.
Figure 23:
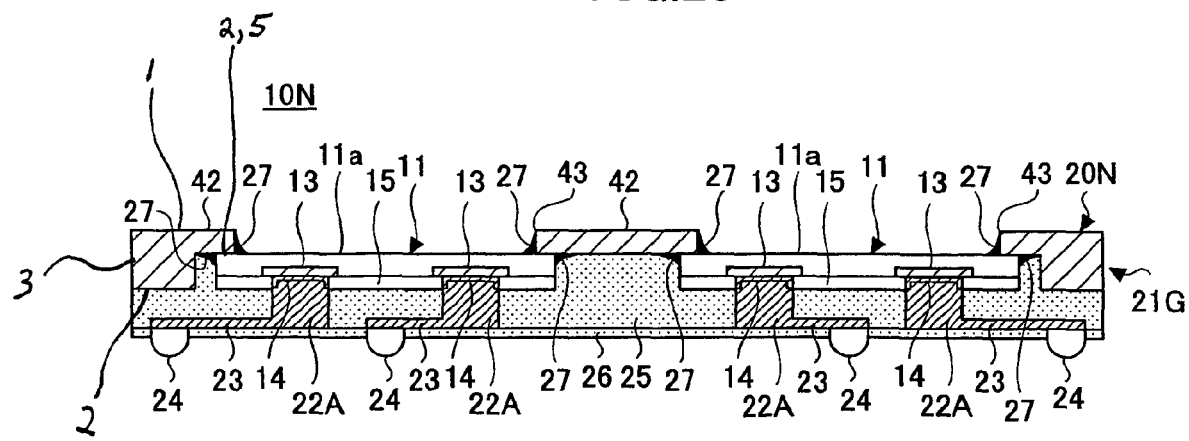
FIG. 23 is a cross-sectional view showing a semiconductor device according to a fourteenth embodiment of the present invention.

The following describes thirteenth and fourteenth embodiments of the present invention. FIG. 21 is a cross-sectional view showing a semiconductor device 10M of the thirteenth embodiment, and FIG. 22 is a perspective view showing the semiconductor device 10M of the thirteen embodiment. FIG. 23 is a cross-sectional view showing a semiconductor device 10N of the fourteenth embodiment.

The semiconductor devices 10M and 10N shown in FIGS. 21-23 are characterized in that joint reinforcing members 27 are provided in order to join semiconductor chips 11 to interposers 20M and 20N more securely.

The semiconductor device 10M of the thirteenth embodiment shown in FIGS. 21 and 22 corresponds to the semiconductor device 10L of the twelfth embodiment shown in FIG. 20, but the joint reinforcing members 27 are provided. The joint reinforcing members 27 are disposed between the upper surfaces of bottom plate sections 45 of cavities 40C and the outer circumferential surfaces of the semiconductor chips 11. Accordingly, as shown in FIG. 22, when the semiconductor device 10M is seen from the outside, the joint reinforcing members 27 are exposed from the cavities 40C.

The semiconductor device 10N of the fourteenth embodiment shown in FIG. 23 corresponds to the semiconductor device 10J of the tenth embodiment shown in FIG. 18, but the joint reinforcing members 27 are provided. The joint reinforcing members 27 are disposed between the upper surface of a top plate section 42 in a cavity 40C and back faces 11a of the semiconductor chips 11 and between the lower surface of the top plate section 42 and the outer circumferential surfaces of the semiconductor chips 11. Therefore, in the semiconductor devices 10M and 10N of the thirteenth and fourteenth embodiments, mechanical strength of the semiconductor chips 11 against interposer bases 21H and 21G can be increased while maintaining high heat releasing efficiency of the semiconductor chips 11.

Figure 24:
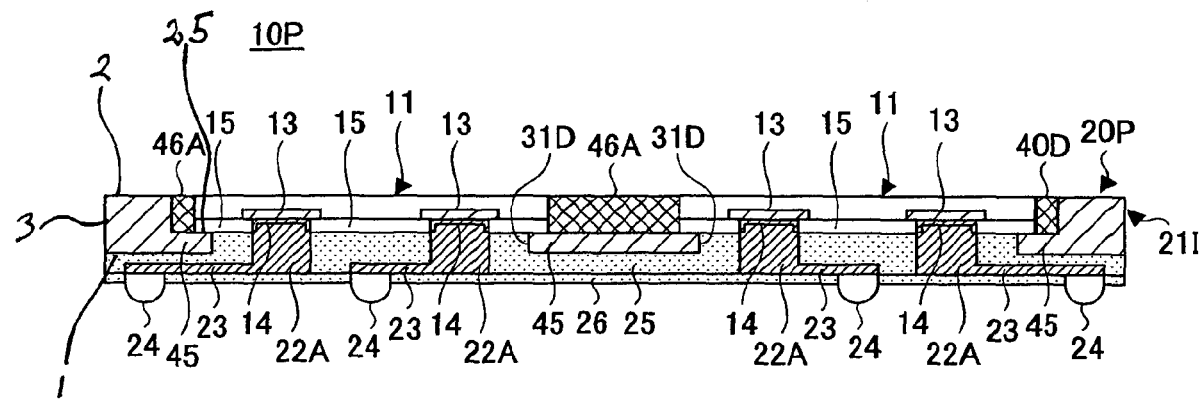
FIG. 24 is a cross-sectional view showing a semiconductor device according to a fifteenth embodiment of the present invention.
Figure 25:
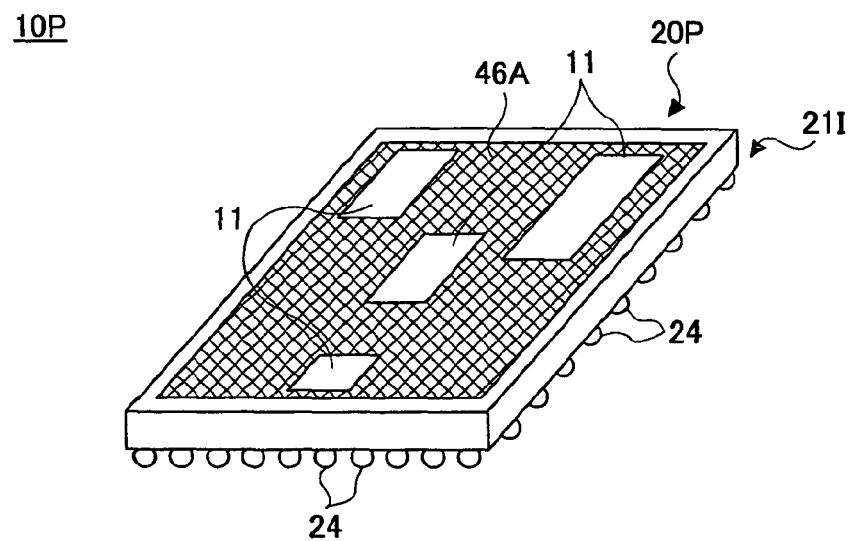
FIG. 25 is a perspective view showing the semiconductor device of the fifteenth embodiment of the present invention.
Figure 26:
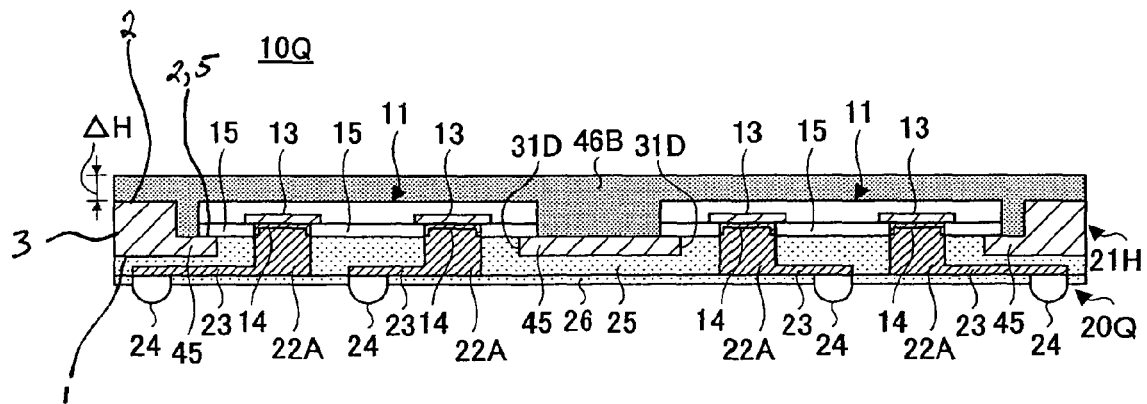
FIG. 26 is a cross-sectional view showing a semiconductor device according to a sixteenth embodiment of the present invention.
Figure 27:
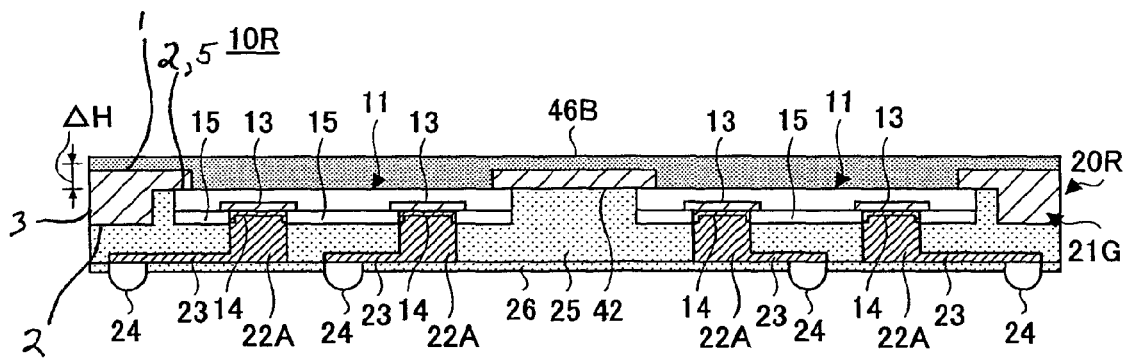
FIG. 27 is a cross-sectional view showing a semiconductor device according to a seventeenth embodiment of the present invention.

The following describes fifteenth-seventeenth embodiments of the present invention. FIG. 24 is a cross-sectional view showing a semiconductor device 10P of the fifteenth embodiment, and FIG. 25 is a perspective view showing the semiconductor device 10P. FIG. 26 is a cross-sectional view showing a semiconductor device 10Q of the sixteenth embodiment. FIG. 27 is a cross-sectional view showing a semiconductor device 10R of the seventeenth embodiment.

The semiconductor devices 10P-10R shown in FIGS. 24-27 are characterized in that sealing resins 46A and 46B for encapsulating semiconductor chips 11 are disposed on interposer bases 21G, 21H, and 12I (correctly, 21I).

The semiconductor device 10P shown in FIG. 24 is configured such that the semiconductor chips 11 are joined to a cavity 40D formed in the interposer base 21I and then the sealing resin 46A is disposed in the space of the cavity 40D and between the semiconductor chips 11. The sealing resin 46A is a mixture of resin (e.g. epoxy-based resin) as a base material and silicon as filler. It is preferable to use highly heat-conductive resin as a base material for improving heat releasing efficiency.

An example of a method of injecting the sealing resin 46A into the space of the cavity 40D and between the semiconductor chips 11 may be screen printing. In a screen printing process, the sealing resin 46A may be directly printed onto the interposer base 21I, to which the semiconductor chips 11 are joined, with a squeegee without using a screen. With this method, since there is no need to use a screen, the process of disposing the sealing resin 46A can be simplified.

The sealing resin 46A is disposed in the space of the cavity 40D and between the semiconductor chips 11 in the way described above, so that the semiconductor chips 11 are secured to the interposer base 21I by being encapsulated with the sealing resin 46A. With this configuration, the semiconductor chips 11 can be securely protected. Also, as in the cases where the joint reinforcing members 27 (see FIGS. 21-23) and the adhesive 44 (see FIG. 19) are provided, the semiconductor chips 11 can be attached more firmly to the interposer base 21I.

As mentioned above, the sealing resin 46A is a mixture of resin (e.g. epoxy-based resin) as a base material and silicon as filler. That is, the sealing resin 46A contains filler of the same material as the interposer base 21I. Therefore, the thermal expansion difference between the sealing resin 46A and the interposer base 21I can be reduced, thereby preventing the semiconductor device 10P from becoming warped due to the presence of the sealing resin 46A.

The semiconductor devices 10Q and 10R shown in FIGS. 26 and 27 are characterized in that the sealing resins 46B are formed by molding. Forming the sealing resins 46B by molding can increase the degree of freedom of the shape of the sealing resins 46B compared to the method of forming the sealing resin 46A shown in FIGS. 24 and 25 by screen printing.

This is because, since the sealing resins 46B are shaped using molds (not shown), the sealing resins 46B with desired shapes can be formed by selecting cavities to be formed in the molds. In the examples shown in FIGS. 26 and 27, the sealing resins 46B are higher than the surfaces of the interposer bases 21H and 21G by heights ΔH.

Since the sealing resins 46B can be formed without depending on the interposer bases 21H and 21G, it is possible to provide a desired mechanical strength to the semiconductor devices 10Q and 10R. Moreover, since the sealing resins 46B are formed by molding, plural sealing resins 46B can be formed at the same time. Therefore, manufacturing efficiency can be improved. The sealing resins 46B may contain fillers of the same material as the interposer bases 21H and 21G so as to prevent the semiconductor devices 10Q and 10R from becoming warped.

Figure 28:
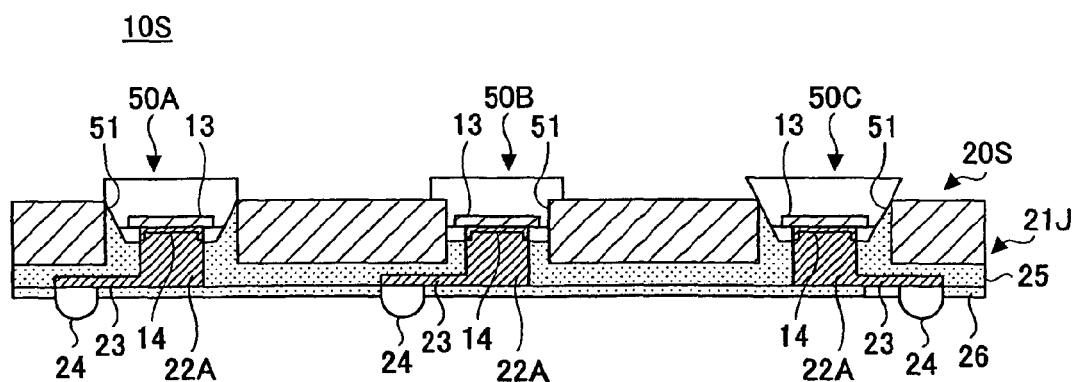
FIG. 28 is a cross-sectional view showing an electronic device according to an eighteenth embodiment of the present invention.
Figure 29:
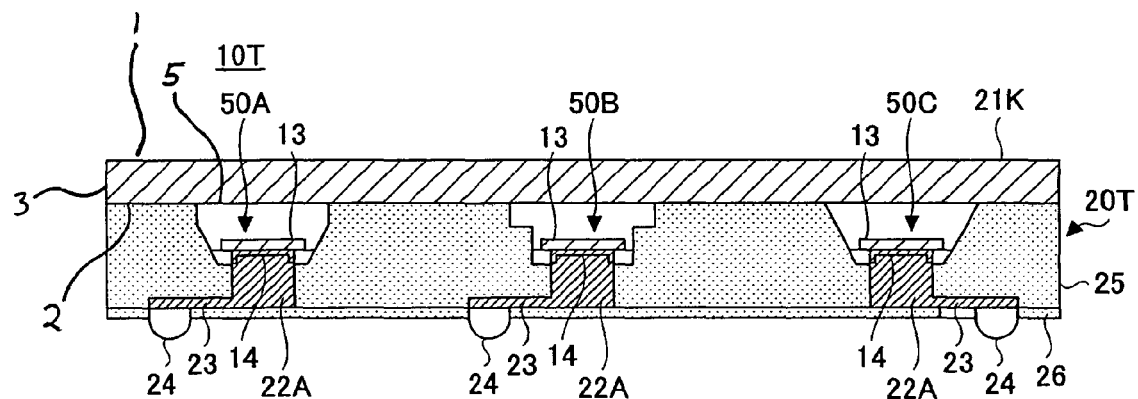
FIG. 29 is a cross-sectional view showing an electronic device according to a nineteenth embodiment of the present invention.
Figure 30:
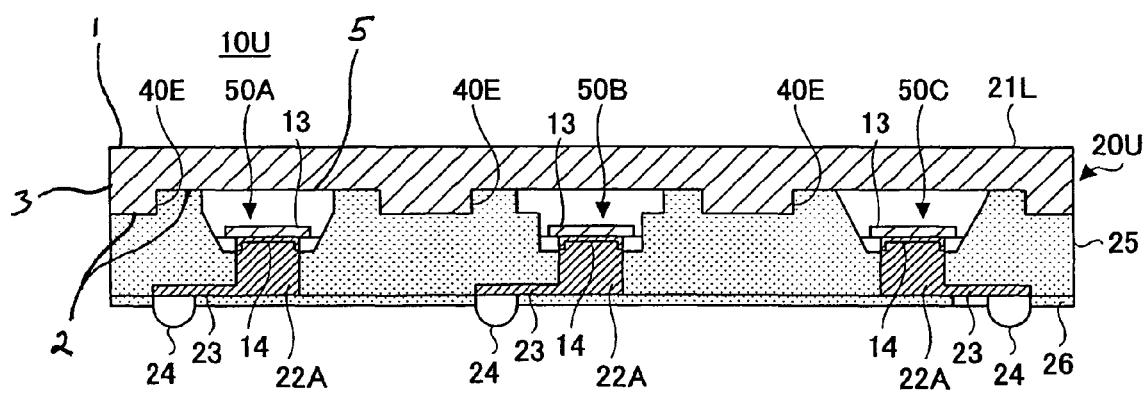
FIG. 30 is a cross-sectional view showing an electronic device according to a twentieth embodiment of the present invention.

The following describes eighteenth-twentieth embodiments of the present invention. FIG. 28 is a cross-sectional view showing an electronic device 10S of the eighteenth embodiment. FIG. 29 is a cross-sectional view showing an electronic device 10T of the nineteenth embodiment. FIG. 30 is a cross-sectional view showing an electronic device 10U of the twentieth embodiment.

In the electronic devices 10A-10R of the above-described embodiments, the semiconductor chips 11 are used as electronic elements to be mounted on the interposer bases 21A-21I. On the other hand, in the eighteenth-twentieth embodiments, chip parts 50A-50C as passive elements are used as electronic elements. Examples of the chip parts 50A-50C include chip capacitors, chip resistors, etc.

The chip parts 50A-50C are prepared by forming resistors or capacitors on substrates such as wafers and then cutting the substrates into pieces by dicing. The chip parts 50A-50C may be formed in different shapes in the dicing process by using dicing blades having different edge angles or different edge widths or by using a half dicing method. In the eighteenth-twentieth embodiments, the chip part 50A is a bevel cut type; the chip part 50B is a step cut type; and the chip part 50C is V-shaped cut type.

In the electronic device 10S shown in FIG. 28, the chip parts 50A-50C are mounted in through holes 51 formed in an interposer base 21J. As in the case of the above-described embodiments, the small base surface joining method is used for joining the chip parts 50A-50C and the interposer base 21J together. Post electrodes 22A are formed directly on electrodes 13 of the chip parts 50A-50C.

Accordingly, as in the case of the above-described embodiments, even when the chip parts 50A-50C as passive elements are used, there is no need to provide bumps and underfill resin for joining. Therefore, the number of components can be reduced. Since an interposer 20S is electrically connected to the chip parts 50A-50C via the post electrodes 22A, the pitch can be reduced compared to the connection structure using bumps. Accordingly, density of the electronic device 10S can be increased.

Since the chip parts 50A-50C and the interposer base 21J are integrated with each other by being brought into direct contact with each other by small base surface joining, the chip parts 50A-50C and the interposer base 21J can be joined together more firmly than when being joined using bumps and underfill resin. Accordingly, reliability of the electronic device 10S can be improved.

The electronic device 10T shown in FIG. 29 is characterized in that a flat substrate made of silicon is used as an interposer base 21K of an interposer 20T. The chip parts 50A-50C are joined at the back surfaces thereof directly to the interposer base 21K by small base surface joining.

The electronic device 10U shown in FIG. 30 is characterized in that cavities 40E are formed in an interposer base 21L of an interposer 20U and that the chip parts 50A-50C are joined to the inside of the corresponding cavities 40E. In this embodiment, the chip parts 50A-50C are joined at the back surfaces thereof directly to the interposer base 21L by small base surface joining. In the electronic devices 10T and 10U shown in FIGS. 29 and 30, since the entire back surfaces of the chip parts 50A-50C are joined to the interposer bases 21K and 21L, the joining force can be increased. Accordingly, reliability of the electronic devices 10T and 10U can be increased.

Figure 31:
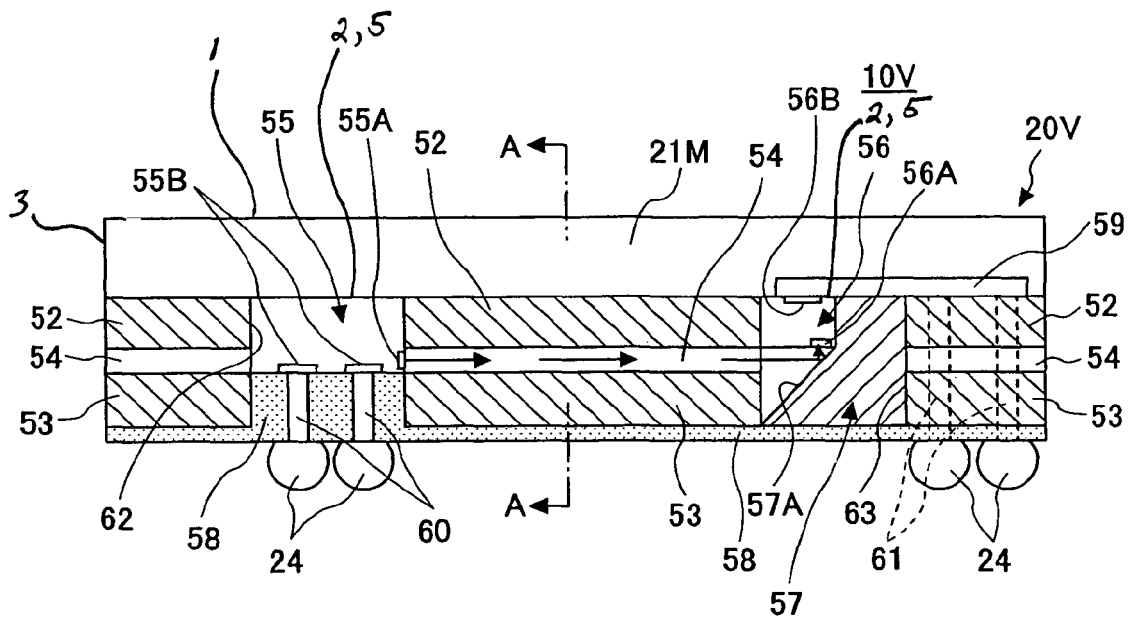
FIG. 31 is a cross-sectional view showing an electronic device according to a twenty first embodiment of the present invention.
Figure 32:
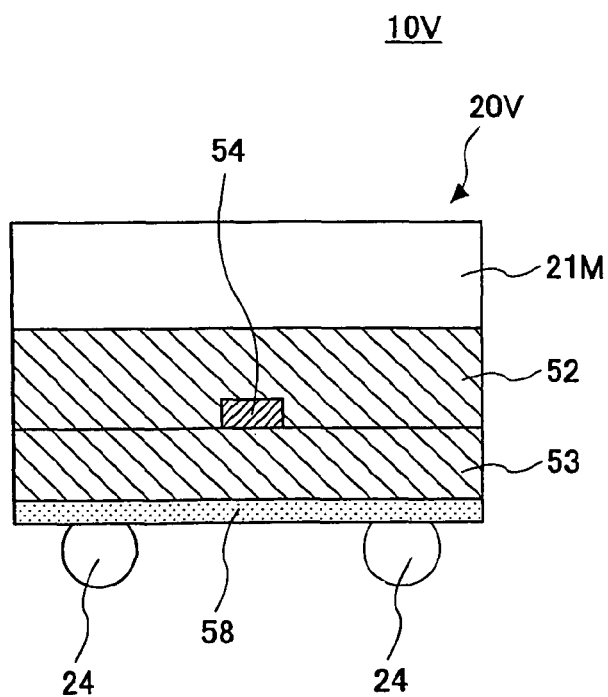
FIG. 32 is a cross-sectional view taken along line A-A of FIG. 31.

The following describes a twenty first embodiment of the present invention. FIG. 31 is a cross-sectional view showing a semiconductor device 10V of the twenty first embodiment, and FIG. 32 is a cross-sectional view taken along line A-A of FIG. 31.

In the electronic devices (semiconductor devices) 10A-10R of the above-described embodiments, the semiconductor chips 11 are used as electronic elements to be mounted on the interposer 20A-20R. In the electronic devices 10S-10U of the eighteenth embodiment-twentieth embodiments, the chip parts 50A-50C as passive elements are used as electronic elements to be mounted on the interposer 20S-20U.

On the other hand, the electronic device 10V of this embodiment is characterized in that optical devices are used as electronic elements. More specifically, in this embodiment, a light emitting element 55 and a light receiving element 56 are used as optical devices, and the light emitting element 55 and the light receiving element 56 are optically connected to each other via an optical waveguide.

The electronic device 10V generally comprises an interposer 20V, the light emitting element 55, the light receiving element 56, etc. In the interposer 20V, a first cladding layer 52, a second cladding layer 53, and a core layer 54 are stacked on an interposer base 21M.

The interposer base 21M is a silicon substrate and has a flat surface (mirror surface) on the side of which the first cladding layer 52 is disposed. A wiring pattern 59 is formed in a predetermined position of the interposer base 21M using a known thin film forming method.

The first cladding layer 52 is made of a glass material. A groove for the core layer 54 is formed in a predetermined position of the first cladding layer 52 (see FIG. 32). The core layer 54 is formed in this groove. The second cladding layer 53 is formed on the surface of the first cladding layer 52 in which the core layer 54 is formed. The second cladding layer 53 is made of the same glass material as the first cladding layer 52.

A refractive index n1 of the core layer 54 is greater than a refractive index n2 of the first cladding layer 52 and the second cladding layer 53 (n1>n2). Therefore, when light is incident on the core layer 54, repeated total reflection of the light occurs within the core layer 54. Thus the light incident on the core layer 54 travels within the core layer 54.

Openings 62 and 63 are formed in predetermined positions of the interposer 20V having the above-described configuration. The opening 62 is formed in the position where the light emitting element 55 is to be located, while the opening 63 is formed in the position where the light receiving element 56 is to be formed. The mirror finished surface of the interposer base 21M is exposed in the positions where the openings 62 and 63 are formed.

The light emitting element 55 is inserted into the opening 62 formed in the interposer base 21M. In the same manner, the light receiving element 56 is inserted into the opening 63 formed in the interposer base 21M. Faces of the light emitting element 55 and the light receiving element 56 facing the interposer base 21M have smooth surfaces (mirror surfaces).

As in the above-described embodiments, the light emitting element 55 and the light receiving element 56 are pressed against the interposer base 21M in a vacuum environment, so that the smooth surfaces are put in tight contact with each other, and the lower principal surface 2 of the interposer base 21M is in direct contact with the top principal surfaces 5 of the light emitting element 55 and the light receiving element 56. As a result, the light emitting element 55 and the light receiving element 56 are integrated with and firmly joined to the interposer base 21M without using adhesive or the like (small base surface joining method).

The light emitting element 55 is a photodiode, and comprises a light emitting portion 55A in the lateral side thereof. The left end (in FIG. 31) of the core layer 54, which is exposed to the opening 62 as a result of forming the opening 62, faces the light emitting portion 55A of the light emitting element 55. Accordingly, a light generated by the light emitting element 55 is incident on the core layer 54 disposed between the opening 62 and the opening 63.

The light emitting element 55 also comprises electrodes 55B in the lower side thereof (in FIG. 31). Post electrodes 60 are mounted on the corresponding electrodes 55B. External connection terminals 24 are formed on the lower ends of the corresponding post electrodes 60.

On the other hand, as mentioned above, the light receiving element 56 is disposed in the opening 63. The light receiving element 56 is a photodiode, and comprises a light receiving portion 56A in the lower side thereof (in FIG. 31) and an electrode 56B in the upper side thereof (in FIG. 31) in this embodiment.

The opening 63 is larger than the light receiving element 56 such that a reflection member 57 is disposed therein together with the light receiving element 56. The reflection member 57 has a reflection surface 57A facing the right end (in FIG. 31)

of the core layer 54 exposed to the opening 63. The angle of the reflection surface 57A is adjusted such that a light generated by the light emitting element 55 and emitted from the right end of the core layer 54 is reflected onto the light receiving portion 56A of the light receiving element 56.

The light emitting element 55 and the light receiving element 56 disposed on the interposer 20V are thus optically connected to each other through the first and second cladding layers 52 and 53 and the core layer 54 serving as a waveguide, allowing signal transmission between the light emitting element 55 and the light receiving element 56. This configuration enables highly accurate signal transmission without loss within the electronic device 10V, thereby increasing reliability of the electronic device 10V.

The electrode 56B of the light receiving element 56 is electrically connected to the left end portion (in FIG. 31) of the wiring pattern 59 formed on the interposer base 21M. Through electrodes 61 are formed extending through the cladding layers 52 and 53 and the core layer 54 to face the right end part of the wiring pattern 59.

The upper end (in FIG. 31) of the through electrodes 61 are electrically connected to the wiring pattern 59. External connection terminals 24 are formed on the lower ends of the corresponding through electrodes 61. An insulation layer 58 is formed in the opening 62 on the side of the electrodes 55B of the light emitting element 55 and on the surface of the cladding layer 53 so as to protect the interposer 20V.

In this way, in this embodiment, the light emitting element 55 and the light receiving element 56 are integrated with the interposer 20V (interposer base 21M) by being brought into direct contact with the interposer 20V. Accordingly, compared to the related-art joining structure between a semiconductor chip and an interposer using bumps and underfill resin, the light emitting element 55 and the light receiving element 56 can be joined to the interposer 20V more firmly. Since bumps (solder) and underfill resin are not used, entry of unwanted substances such as solder, flux, resin, etc., into portions where the light emitting element 55 and the light receiving element 56 are optically connected to the core layer 54 and the resulting contamination of these portions are avoided, thereby ensuring optical signal transmission. This can also increase reliability of the electronic device 10V.

The invention claimed is:

1. An electronic device comprising:
an electronic element; and
an interposer including an interposer base to which the electronic element is joined, and a plurality of post electrodes connected to corresponding electrodes of the electronic element;
wherein the electronic element and the interposer base are made of silicon and the interposer base comprises a silicon wafer piece,
said interposer base being defined by an upper principal surface, a lower principal surface and a sidewall surface connecting said upper principal surface and said lower principal surface, said plurality of post electrodes extending between said upper principal surface and said lower principal surface of said interposer base so as to penetrate through the silicon wafer piece, each of said plurality of post electrodes having a top end exposed at said upper principal surface, each of said plurality of post electrodes having a bottom end exposed at said lower principal surface,
said electronic element having a top principal surface in direct contact with said lower principal surface of said interposer, said electronic element carrying said plurality of electrodes respectively in correspondence to said plurality of post electrodes in a state buried in said electronic element, said plurality of electrodes being exposed at said top principal surface of said electronic element and in contact with corresponding bottom ends of said plurality of post electrodes, said plurality of electrodes forming a flush surface with said top principal surface of said electronic element,
a rewiring layer being formed upon said top end of said post electrode in electrical connection therewith,
an external connection terminal being formed directly on and in direct contact with a top surface of said rewiring layer; wherein the external connection terminal is a solder ball or solder bump.

2. An electronic device comprising:
an electronic element; and
an interposer including an interposer base to which the electronic element is joined, and a plurality of post electrodes that are disposed inside one or more through holes formed in the interposer base and are connected to corresponding electrodes of the electronic element,
wherein the electronic element and the interposer base are made of silicon and the interposer base comprises a silicon wafer piece,
said interposer base being defined by an upper principal surface, a lower principal surface and a sidewall surface connecting said upper principal surface and said lower principal surface, said one or more through holes extending between said upper principal surface and said lower principal surface of said interposer base so as to penetrate through the silicon wafer piece, each of said plurality of post electrodes having a top end exposed at said upper principal surface, each of said plurality of post electrodes having bottom end exposed at said lower principal surface,
said electronic element having a top principal surface in direct contact with said lower principal surface of said interposer, said electronic element carrying said electrodes respectively corresponding to said plurality of post electrodes in a state buried in said electronic element, said plurality of electrodes being exposed at said top principal surface of said electronic element and in contact with corresponding bottom ends of said plurality of post electrodes, said plurality of electrodes forming a flush surface with said top principal surface of said electronic element,
a rewiring layer being formed upon said top end of said post electrode in electrical connection therewith,
an external connection terminal being formed directly on and in direct contact with a top surface of said rewiring layer; wherein the external connection terminal is a solder ball or solder bump.

3. The electronic device as claimed in claim 1 or 2, wherein the electronic element and the interposer base are made of the same material.

4. The electronic device as claimed in claim 1 or 2,
wherein the electronic device comprises a first insulation layer formed at least in a position on the electronic element to be joined to the interposer base; and
the interposer base comprises a second insulation layer formed at least in a position on the interposer base to be joined to the electronic element.

5. The electronic device as claimed in claim 2, wherein the post electrodes are formed in the single through hole.

6. The electronic device as claimed in claim 1 or 2, wherein a recess is formed in the interposer base such that the electronic element is accommodated in the recess.

7. The electronic device as claimed in claim 1 or 2, wherein plural of the electronic elements are mounted to the interposer base.

8. The electronic device as claimed in claim 1 or 2, wherein a back surface of the electronic element is joined to the interposer base.

9. The electronic device as claimed in claim 1 or 2, wherein a sealing resin encapsulating the electronic element is disposed on the interposer base.

10. The electronic device as claimed in claim 1 or 2, wherein the electronic element is a semiconductor chip.

11. The electronic device as claimed in claim 1 or 2, wherein the electronic element is a passive element.

12. An electronic device comprising:
an electronic element; and
an interposer to which the electronic element is joined, and the interposer including an interposer base, said interposer base comprising a silicon wafer piece and said interposer base being defined by an upper principal surface, a lower principal surface and a sidewall surface connecting said upper principal surface and said lower principal surface;
wherein said lower principal surface of said interposer base being in direct contact to a top principal surface of said electronic element, and
wherein the electronic element is made of silicon,
said electronic element having a top principal surface in direct contact with said lower principal surface of said interposer, said electronic element carrying electrodes respectively corresponding to a plurality of post electrodes penetrating through said interposer base from said lower principal surface to said upper principal surface of said interposer base in a state buried in said electronic element, said plurality of electrodes being exposed at said top principal surface of said electronic element and in contact with corresponding bottom ends of said plurality of post electrodes, said plurality of electrodes forming a flush surface with said top principal surface of said electronic element,
a rewiring layer being formed upon said to end of said post electrode in electrical connection therewith,
an external connection terminal being formed directly on and in direct contact with a top surface of said rewiring layer; wherein the external connection terminal is a solder ball or solder bump.

13. The electronic device as claimed in claim 12,
wherein the electronic element is an optical device; and
the interposer is provided with an optical waveguide optically connected to the optical device.

14. The electronic device as claimed in claim 1, wherein the portion of the interposer base and the portion of the electronic element that are in direct contact with each other are the same material.

15. The electronic device as claimed in claim 1, wherein said external connection terminal is formed on an end of said rewiring layer opposite to the end connected to said post electrode.

16. The electronic device as claimed in claim 2, wherein said electrodes of said electronic element are provided at a side of said lower principal surface of said interposer base, and wherein said external connection terminal is provided at a side of said upper principal surface of said interposer base.

17. The electronic device as claimed in claim 12, wherein said electrodes of said electronic element are provided at a side of said lower principal surface of said interposer base, and wherein said external connection terminal is provided at a side of said upper principal surface of said interposer base.

* * * * *